US007247257B2

(12) United States Patent
Murazaki et al.

(10) Patent No.: US 7,247,257 B2
(45) Date of Patent: *Jul. 24, 2007

(54) LIGHT EMITTING DEVICE

(75) Inventors: Yoshinori Murazaki, Anan (JP); Takashi Ichihara, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/384,548

(22) Filed: Mar. 21, 2006

(65) Prior Publication Data
US 2006/0163999 A1 Jul. 27, 2006

Related U.S. Application Data

(62) Division of application No. 10/475,314, filed as application No. PCT/JP02/03901 on Apr. 19, 2002, now Pat. No. 7,091,656.

(30) Foreign Application Priority Data

| Apr. 20, 2001 | (JP) | P 2001-123457 |
| Jul. 4, 2001 | (JP) | P 2001-203240 |
| Sep. 21, 2001 | (JP) | P 2001-288070 |
| Oct. 18, 2001 | (JP) | P 2001-320201 |

(51) Int. Cl.
*H01J 1/62* (2006.01)
(52) U.S. Cl. .................. 252/301.4 P; 252/301.6 P; 252/301.4 H; 313/503; 257/98
(58) Field of Classification Search .............. 257/98; 313/503; 252/301.4 P, 301.4 H, 301.6 P
See application file for complete search history.

(56) References Cited

U.S. PATENT DOCUMENTS

| 3,513,103 | A | * | 5/1970 | Shaffer ................. 252/301.4 P |
| 6,051,925 | A | | 4/2000 | Boerner et al. |
| 6,242,857 | B1 | | 6/2001 | Hashimoto et al. |
| 6,252,254 | B1 | | 6/2001 | Soules et al. |
| 6,501,100 | B1 | * | 12/2002 | Srivastava et al. ............. 257/79 |
| 6,616,862 | B2 | * | 9/2003 | Srivastava et al. ..... 252/301.4 P |
| 6,685,852 | B2 | * | 2/2004 | Setlur et al. ............ 252/301.4 R |

(Continued)

FOREIGN PATENT DOCUMENTS

DE 20115914.7 2/2003

(Continued)

OTHER PUBLICATIONS

Translation of the International Preliminary Examination Report mailed Mar. 17, 2004 in corresponding PCT Application No. PCT/JP02/03901.

(Continued)

*Primary Examiner*—C. Melissa Koslow
(74) *Attorney, Agent, or Firm*—Nixon & Vanderhye P.C.

(57) ABSTRACT

To minimize the variability in the emitted light color and improve the unevenness of color tone, a light emitting device comprises a light emitting element and a fluorescent substance that is excited by the light emitting element, wherein the light emitting element has an emission spectrum in a region from ultraviolet to visible light of short wavelengths, and the fluorescent substance has an emission spectrum that includes two or more emission peaks with at least two peaks of the two or more peaks being in the relation of complementary colors of each other.

7 Claims, 13 Drawing Sheets

U.S. PATENT DOCUMENTS

| | | |
|---|---|---|
| 6,717,355 B2 | 4/2004 | Takahashi et al. |
| 6,759,804 B2 * | 7/2004 | Ellens et al. ............... 313/512 |
| 6,809,471 B2 | 10/2004 | Setlur et al. |
| 6,891,203 B2 | 5/2005 | Kozawa et al. |
| 6,924,596 B2 | 8/2005 | Sato et al. |
| 7,091,656 B2 * | 8/2006 | Murazaki et al. ........... 313/487 |
| 2002/0080501 A1 | 6/2002 | Kawae et al. |
| 2002/0158565 A1 | 10/2002 | Setlur et al. |
| 2003/0146411 A1 | 8/2003 | Srivastava et al. |
| 2004/0000862 A1 | 1/2004 | Setlur et al. |
| 2005/0156496 A1 | 7/2005 | Takashima et al. |
| 2005/0162069 A1 | 7/2005 | Ota et al. |
| 2005/0179364 A1 | 8/2005 | Murazaki |

FOREIGN PATENT DOCUMENTS

| | | |
|---|---|---|
| JP | 47-49989 | 12/1972 |
| JP | 05-152609 | 6/1993 |
| JP | 09-153645 | 6/1997 |
| JP | 10-242513 | 9/1998 |
| JP | 10-275934 | 10/1998 |
| JP | 11-510968 | 9/1999 |
| JP | 2000-031532 | 1/2000 |
| JP | 2000-183408 | 6/2000 |
| JP | 2000-230172 | 8/2000 |
| JP | 2000-509912 | 8/2000 |
| JP | 2000-347601 | 12/2000 |
| JP | 2003-206482 | 7/2003 |
| JP | 2003-533852 | 11/2003 |
| JP | 2004-107623 | 4/2004 |
| JP | 2005-526899 | 9/2005 |
| JP | 2005-60468 | 10/2005 |
| TW | 385063 | 3/2000 |
| TW | 507388 | 10/2002 |
| TW | 535304 | 6/2003 |
| WO | 97/48138 | 12/1997 |
| WO | WO 01/89000 | 11/2001 |
| WO | WO 2004/003106 | 1/2004 |

OTHER PUBLICATIONS

Edited by Phosphor Research Society, Keikotai Handbook, Ohm, Dec. 25, 1987, pp. 207-233.

* cited by examiner

LIGHT EMITTING DEVICE

CROSS-REFERENCES TO RELATED APPLICATIONS

This application is a divisional of U.S. application Ser. No. 10/475,314, filed Oct. 20, 2003 now U.S. Pat. No. 7,091,656, which is the US national phase of international application PCT/JP02/03901 filed 19 Apr. 2002, which designated the US. PCT/JP02/03901 claims priority to JP Application No. 2001-123457 filed 20 Apr. 2001, JP Application No. 2001-203240 filed 4 Jul. 2001, JP Application No. 2001-288070 filed 21 Sep. 2001 and JP 2001-320201 filed 18 Oct. 2001. The entire contents of these applications are incorporated herein by reference.

BACKGROUND OF THE INVENTION

The present invention relates to a light emitting device that uses a light emitting element and a fluorescent substance and can be used for such applications as illumination, display, indicator and other light sources, and particularly to a white light emitting device that uses a fluorescent substance that is excited by the light emitted by a semiconductor light emitting element and emits light having a spectrum in the visible region.

Various semiconductor light emitting elements have been developed such as light emitting diode and laser diode. These semiconductor light emitting elements are replacing part of electric bulbs and cold cathode ray tubes as light sources for display, back light and indicator, by taking advantage of such features as the capability to run on low voltage, small size, light weight, small thickness, long life, high reliability and low power consumption.

In recent years, such light emitting devices have been developed as nitride semiconductor is used as the light emitting element that can efficiently emit light in a region raging from ultraviolet to visible light of short wavelengths. Such LEDs capable of emitting blue or green light with 10 candela or higher luminous intensity have been commercialized by using light emitting elements having quantum well structure with activation (light emission) layer made of nitride semiconductor (for example, mixed crystal of InGaN).

It has also been made possible to carry out color mixing including white color by combining the light emitted by such an LED chip (light emitting element) and the light emitted by a fluorescent substance that is excited by the light of the LED chip thereby to produce fluorescence.

Such light emitting diodes are disclosed, for example, in Japanese Non-examined Patent Publication No. 152609/1993, Japanese Non-examined Patent Publication No. 153645/1997 and Japanese Non-examined Patent Publication No. 10-242513/1998.

Specifically, the light emitting element is caused to emit ultraviolet rays or blue light of relatively short wavelengths in the visible region, and the fluorescent substance is excited by the light of this light emitting element so as to emit visible light of wavelengths longer than the light emitted by the light emitting element. The constitution that employs color mixing of the light emitted by the light emitting element (visible light) and the light emitted by the fluorescent substance has an advantage that the structure can be simplified and the output power can be increased, although color drift is likely to occur. When a light emitting element that emits ultraviolet rays is used, on the other hand, such a constitution is employed as fluorescent substances capable of emitting light of red, green and blue colors so as to produce white light are used, so that the color can be adjusted relatively easily since only the light emitted by the fluorescent substances is used. When a light emitting element that emits ultraviolet ray is used, in particular, mass productivity can be improved since deviation of wavelength of the light emitted by the semiconductor light emitting element can be accommodated somewhat and the chromaticity can be determined only by the color of light emitted by the fluorescent substance.

However, in the light emitting device of the prior art where two or more kinds of fluorescent substance are used and a desired color is produced by color mixing of the light emitted by the fluorescent substances, intensity ratio of light emitted by two fluorescent substances changes due to difference in the excitation spectrum between the two fluorescent substances, when emission wavelength of the light emitting element used in excitation changes.

As a result, in the light emitting device of the prior art where two or more kinds of fluorescent substance are used, it has been difficult to satisfactorily suppress the variation of chromaticity of the light emitting device since variability in the emission wavelength of light emitting element affects the chromaticity of the light emitting device.

For the semiconductor light emitting element to be used as light source including illumination by making use of the advantage thereof, the light emitting device of the prior art is not satisfactory and it is required to increase the luminance and improve the mass productivity.

There has not been known any fluorescent substance that can be excited by near ultraviolet rays or visible light of short wavelengths so as to emit red light with sufficient luminance.

Therefore, there is such a case as the proportion of mixing the red light emitting fluorescent substance must be increased, which results in a decrease in the relative luminance. When the fluorescent substance is excited by near ultraviolet rays, variability in the wavelength of light emitted by the light emitting element may lead to a decrease in the luminance of red light emitted by the fluorescent substance due to the shift in the wavelength of light that excites the fluorescent substance, thus resulting in a change in chromaticity of light emitted by the light emitting device.

Also in case the fluorescent substance is excited by a fluorescent substance emitted by the light emitting element, it is desired that a required color can be achieved by controlling the composition of the fluorescent substance in order to improve the mass productivity.

BRIEF SUMMARY OF THE INVENTION

The present invention has been made to solve the problems described above. A first light emitting device according to the present invention comprises a light emitting element and a fluorescent substance that is excited by the light emitting element, wherein the light emitting element has an emission spectrum in a region from ultraviolet to visible light of short wavelengths, and the fluorescent substance has an emission spectrum that includes two or more emission peaks with at least two peaks of the two or more peaks being in the relation of complementary colors of each other.

As used herein, the expression that "two peaks are in the relation of complementary colors of each other" means that when a light of one peak and a light of the other peak mixed, white light which include greenish white, bluish white, purplish white, reddish white and yellowish can be obtained. For example, blue light and yellow light, blue green light and red light are in the relation of complementary colors of each other. In the present invention, two peaks in the relation of complementary colors preferably are set so that one peak is set in the range of 380 nm-485 nm and the other peak is set in the range of 575 nm-630 nm.

In the chromaticity diagram, colors on a line perpendicular to Planckian locus have same color temperature, if the colors are different in the chromaticness. Therefore, in the direction of perpendicular to Planckian locus, preferable white region cannot be defined by using the color temperature. However, two peaks in the relation of complementary colors preferably are set so that the mixed light of one peak light and the other peak light is positioned on Planckian locus or near to Planckian locus to obtain the high emitting efficiency, since the light positioned on Planckian locus can be emitted with highest brightness.

The expression to have "an emission spectrum in a region from ultraviolet to visible light of short wavelengths" means that an emission spectrum in a region from 340 nm to 440 nm can be observed.

The first light emitting device according to the present invention having such a constitution as described above can minimize the variability in the emitted light color and improve the unevenness of color tone, since the emission spectrum of the fluorescent substance hardly changes even when the emission spectrum of the fluorescent substance changes due to variability in the manufacturing process.

The first light emitting device of the present invention preferably has main emission wavelength of the light emitting element longer than 360 nm in the near ultraviolet region, which makes the constitution simpler and mass production of the light emitting device easier.

In the first light emitting device according to the present invention, it is preferable that, of the two emission peaks of the fluorescent substance that are in the relation of complementary colors of each other, the emission peak of shorter wavelength has smaller half width than the other emission peak.

This makes it possible to extract long wavelength components relatively easily and obtain the light emitting device that has excellent color rendering performance.

Moreover, the first light emitting device according to the present invention may have an additional fluorescent substance that has another emission peak between the two emission peaks that are complementary colors of each other.

This constitution makes the light emitting device capable of emitting white light and also capable of emitting light of a desired intermediate color.

The first light emitting device of the present invention may also be caused to emit light of a desired color by controlling the composition of the fluorescent substance so as to adjust the intensity ratio of the two emission peaks that are complementary colors of each other.

This allows fine adjustment of the light color in the white region where human eyes can perceive even a slight difference.

A second light emitting device according to the present invention comprises a light emitting element and a fluorescent substance that is excited by the light emitting element, wherein the light emitting element has an emission spectrum in a region from ultraviolet to visible light of short wavelengths, and the fluorescent substance is Eu-activated alkali earth metal halogen-apatite fluorescent substance that includes at least an element selected from the group consisting of Mg, Ca, Ba, Sr and Zn and an element selected from the group consisting of Mn, Fe, Cr and Sn.

The second light emitting device of the present invention can emit white light with high luminance and can be mass produced satisfactorily.

In the first and the second light emitting devices of the present invention, a nitride semiconductor that includes at least In and Ga, or a nitride semiconductor that includes at least Ga and Al can be used for the light emitting layer of the light emitting element. This makes it possible for the light emitting element to emit light in a region ranging from near ultraviolet to visible light of short wavelengths with high luminance. Also because width of the emission spectrum of the light emitting element can be made smaller, the fluorescent substance can be excited efficiently and changes in the color tone of the light emitted by the light emitting device can be suppressed. It goes without saying that the above applies to a nitride semiconductor that includes In, Ga and Al as well.

In the first and the second light emitting devices of the present invention, the light emitting element preferably comprises an n-type nitride semiconductor layer that includes an n-type contact layer, a light emitting layer and a p-type nitride semiconductor layer that includes a p-type contact layer being formed one on another, with the p-type contact layer having light transmitting p electrode made of metal, that includes one kind selected from the group of gold and platinum group, covering substantially the entire surface thereof, while thickness of the light transmitting p electrode and thickness of the n-type contact layer being set so that sheet resistance Rp $\Omega/\square$ of the light transmitting p electrode and sheet resistance Rn $\Omega/\square$ of the n-type contact layer satisfy the relationship of $Rp \geq Rn$.

While external quantum efficiency and emission distribution vary depending on the balance between the sheet resistance of the n-type contact layer and sheet resistance of the light transmitting p electrode, a light emitting element having relatively good external quantum efficiency can be made and a light emitting device having high output power can be made when the relationship of $Rp \geq Rn$ is satisfied. Impurity concentrations in the contact layers are preferably in a range from $10^{17}$ to $10^{20}/cm^3$.

In the constitution described above, sheet resistance of the light transmitting p electrode is preferably 10 $\Omega/\square$ or higher, which makes it possible to easily form an n-type gallium nitride compound semiconductor layer having sheet resistance Rn that satisfies the relationship of $Rp \geq Rn$.

The thickness of the light transmitting p electrode is preferably in a range from 50 Å to 150 Å. This makes light transmittance far higher than the case where the light transmitting p electrode is thicker than 150 µm, resulting in drastically improved external quantum efficiency and a light emitting device having high output power.

In case the light transmitting p electrode is formed from a multi-film layer, made of one kind of metal selected from a group consisting of gold and platinum group elements and at least one kind of other metal, or an alloy, then sheet resistance of the light transmitting p electrode is preferably controlled by adjusting the content of gold and platinum group element. Gold and platinum group elements have high absorptivity for light of short wavelengths, and therefore preferably included in concentrations in a range from 20% to 50% since less content leads to higher light transmittance.

Thus external quantum efficiency of the semiconductor light emitting element of the present invention is improved and higher output power can be achieved by setting the sheet resistance of the n-type contact layer and the sheet resistance of the light transmitting p electrode so as to satisfy the relationship described above.

The first and second light emitting devices of the present invention also preferably have an electrode disposed in the vicinity of at least one side of the semiconductor light emitting element on the n-type contact layer and a base electrode formed at a position adjacent to the side that opposes the side in the vicinity of which the n electrode is disposed on the light transmitting p electrode, while extension conductors are provided along two lines being connected to the base electrode that extends along the side of the light transmitting p electrode on both sides thereof in the vicinity of which the base electrodes are located.

While there is no limitation to the shape of the base electrode and such shapes as near rectangle and circle can be preferably used, strong emission of light occurs in the periphery of the base in case the base electrode becomes too small. Therefore in the constitution described above, the area of emitting strong light is increased by providing the extension conductors extending from the base electrode. In the n electrode, it is preferable to make the notch area of the light emitting plane smaller in order to expose the n-type layer. Number of the extension conductors may be more than two.

In the constitution described above, uniform distribution of light emission can be obtained since the n electrode is disposed near at least one side of the light emission element and the base electrode is provided in the vicinity of the side that opposes the side whereon the n electrode is provided.

Moreover, in the first and second light emitting devices of the present invention, it is preferable that the n electrode is disposed at one corner of the semiconductor light emitting element near two sides thereof, and the base electrode is located near the side in the vicinity of which the n electrode is located.

The extension conductors are preferably formed in an arc shape so as to be equi-distanced from the n electrode, which results in more uniform light intensity distribution.

In the second light emitting device of the present invention, the fluorescent substance is preferably Eu-activated alkali earth metal halogen-apatite fluorescent substance including at least Mn and/or Cl. This fluorescent substance has high light fastness and weatherability, capable of efficiently absorbing the light emitted by the nitride semiconductor light emitting element, emit light in white region and allows it to obtain a desired emission spectrum by controlling the composition thereof. The fluorescent substance is also capable of emitting yellow or red light with high luminance by absorbing near ultraviolet rays. Therefore a light emitting device having excellent color rendering performance can be made. The alkali earth metal halogen-apatite fluorescent substance includes alkali earth metal chlor-apatite fluorescent substance as a matter of course.

In the second light emitting device of the present invention, the fluorescent substance may be one represented by $(M_{1-x-y}Eu_xM'_y)_{10}(PO_4)_6Q_2$ (M represents at least one kind of element selected from Mg, Ca, Ba, Sr and Zn, M' represents at least one kind of element selected from Mn, Fe, Cr and Sn, and Q represents at least one kind of halogen element selected from F, Cl, Br and I, where $0.0001 \leq x \leq 0.5$ and $0.0001 \leq y \leq 0.5$).

When Cl is used for Q in the formula described above, the light emitting device can be mass-produced satisfactorily and allows color mixing of the light emitted.

The first and second light emitting devices of the present invention may include, in addition to the fluorescent substance described above, at least one kind of fluorescent substance selected from the group consisting of $BaMg_2Al_{16}O_{27}$:Eu, $BaMgAl_{10}O_{17}$:Eu, $BaMgAl_{10}O_{17}$:Eu, Mn, $(Sr, Ca, Ba)_5(PO_4)_3Cl$: Eu, $(Sr, Ca, Ba)_{10}(PO_4)_6Cl_2$, $SrAl_2O_4$:Eu, $Sr_4Al_{14}O_{25}$:Eu, ZnS:Cu, $Zn_2GeO_4$:Mn, $BaMg_2Al_{16}O_{27}$:Eu, Mn, $Y_2O_2S$:Eu, $La_2O_2S$:Eu and $Gd_2O_2S$:Eu.

This constitution achieves a light emitting device that allows it to make fine adjustment of the color tone and can emit white light having high color rendering performance with relatively simple constitution.

The first and second light emitting devices of the present invention may include, in addition to the fluorescent substance, one represented by $(M_{1-x}Eu_x)_{10}(PO_4)_6Q_2$ (M represents at least one kind of element selected from Mg, Ca, Ba, Sr and Zn, and Q represents at least one kind of halogen element selected from F, Cl, Br and I, where $0.0001 \leq x \leq 0.5$ and $0.0001 \leq y \leq 0.5$).

With the constitution described above, the light emitting device can emit white light having high color rendering performance with relatively simple constitution in case Cl is used for Q.

A third light emitting device according to the present invention comprises a light emitting element and a fluorescent substance that is excited by the light emitting element, wherein the light emitting element has an emission spectrum in from ultraviolet to visible light of short wavelengths, and the fluorescent substance is alkali earth metal halogen-apatite fluorescent substance that includes at least an element selected from Mg, Ca, Ba, Sr and Zn and an element selected from Mn, Fe, Cr and Sn.

The third light emitting device can emit white light with high luminance and can be mass produced satisfactorily.

In the third light emitting device, the fluorescent substance is preferably alkali earth metal halogen-apatite fluorescent substance including at least Mn and/or Cl, which gives the fluorescent substance high light fastness and weatherability. This fluorescent substance can efficiently absorb the light emitted by the nitride semiconductor.

The first to third light emitting devices constituted as described above have better luminance and mass productivity as light sources including illumination, making use of the advantage of the light emitting element.

Particularly, since the fluorescent substance has an excitation spectrum that is flat over a relatively broad range of wavelengths, unevenness in the color tone caused by variability in the emission spectrum of the semiconductor light emitting element can be improved.

It is also made easier to manufacture the light emitting device with better mass productivity. The light emitting device also allows it to extract components of long wavelengths relatively easily while providing high color rendering performance.

Moreover, the light emitting device is capable of emitting white light, providing light of a desired intermediate color with high luminance, and allows delicate adjustment of the color tone.

A fourth light emitting device according to the present invention comprises a light emitting element and a fluorescent substance that is excited by the light emitting element, wherein the light emitting element has an emission spectrum in a region ranging from ultraviolet to visible light of short wavelengths, and the fluorescent substance includes a first fluorescent substance that has an emission spectrum different from that of the light emitting element and a second fluorescent substance that has an emission spectrum different from that of the first fluorescent substance.

This constitution improves unevenness in the color tone caused by variability in the emission spectrum of the light emitting element.

In the fourth light emitting device of the present invention, the second fluorescent substance may also be excited at least one of the light emitted by the light emitting element and light emitted by the first fluorescent substance.

This constitution makes it possible to use such a fluorescent substance, that cannot be excited by the semiconductor light emitting element but can be excited by the light emitted by the first fluorescent substance, as the second high output. This constitution can also mitigate the influence of variability of the emission spectrum of the semiconductor light emitting element, suppress the variability in chromaticity and improve the unevenness in color tone.

In the fourth light emitting device of the present invention, it is preferable that the emission spectrum of at least one of the first fluorescent substance and the second fluorescent substance has two or more peaks, of which two are in the relationship of complementary colors of each other.

This constitution can make the light emitting device having less color deviation and higher color rendering performance.

The fourth light emitting device of the present invention may also be constituted so that the first fluorescent substance has an emission spectrum having a peak wavelength that is in the relationship of complementary colors with the peak wavelength of the emission spectrum of the second fluorescent substance.

This constitution allows fine adjustment of the light color in the white region where human eyes can perceive even a slight difference.

The fourth light emitting device of the present invention is also preferably constituted so that the main emission wavelength of the light emitting element is longer than 360 nm in the ultraviolet region This constitution makes it possible to emit light of an intermediate color with high luminance.

In the fourth light emitting device of the present invention, cerium-activated fluorescent substance based on yttrium aluminum oxide may also be used as the second fluorescent substance.

In the fourth light emitting device according to the present invention, the first fluorescent substance is preferably Eu-activated alkali earth metal halogen-apatite fluorescent substance that includes at least an element selected from Mg, Ca, Ba, Sr and Zn and an element selected from Mn, Fe, Cr and Sn.

The fluorescent substance has high light fastness and weatherability and is capable of efficiently absorbing the light emitted by the light emitting element made of nitride semiconductor.

The fluorescent substance can also emit light in white region and allows it to obtain a desired emission spectrum by controlling the composition thereof. The fluorescent substance is also capable of emitting yellow or red light with high luminance by absorbing near ultraviolet rays. Therefore a light emitting device having excellent color rendering performance can be made by using this fluorescent substance. The alkali earth metal halogen-apatite fluorescent substance includes alkali earth metal chlor-apatite fluorescent substance, as a matter of course.

In the fourth light emitting device of the present invention, the first fluorescent substance is preferably a fluorescent substance selected from the group consisting of the materials (1) to (13) described below.

(1) A fluorescent substance represented by $(M1_{1-a-b}L1_b)_{10}(PO_4)_6Q_2$ wherein M1 represents at least one element selected from Mg, Ca, Ba, Sr and Zn, L1 represents at least one element selected from Mn, Fe, Cr and Sn, and Q represents at least one halogen element selected from F, Cl, Br and I, where $0.0001 \leq a \leq 0.5$ and $0.0001 \leq b \leq 0.5$.

(2) A fluorescent substance represented by $(M1_{1-a}Eu_a)_{10}(PO_4)_6Q_2$ wherein M1 represents at least one element selected from Mg, Ca, Ba, Sr and Zn, and Q represents at least one halogen element selected from F, Cl, Br and I, where $0.0001 \leq a \leq 0.5$.

(3) A fluorescent substance represented by $(M1_{1-a-b}Mn_b)_{10}(PO_4)_6Q_2$ wherein M1 represents at least one element selected from Mg, Ca, Ba, Sr and Zn, and Q represents at least one halogen element selected from F, Cl, Br and I, where $0.0001 \leq a \leq 0.5$ and $0.0001 \leq b \leq 0.5$.

(4) A fluorescent substance represented by $(M2_{1-a-c}Eu_aBa_c)_{10}(PO_4)_6Q_2$ wherein M2 represents at least one element selected from Mg, Ca, Sr and Zn, and Q represents at least one halogen element selected from F, Cl, Br and I, where $0.0001 \leq a \leq 0.5$ and $0.10 \leq c \leq 0.98$.

(5) A fluorescent substance represented by $M1_{1-a}Eu_aAl_2O_4$ wherein M1 represents at least one element selected from Mg, Ca, Ba, Sr and Zn, where $0.0001 \leq a \leq 0.5$.

(6) A fluorescent substance represented by $M1_{1-a-b}Eu_aMn_bAl_2O_4$ wherein M1 represents at least one element selected from Mg, Ca, Ba, Sr and Zn, where $0.0001 \leq a \leq 0.5$ and $0.0001 \leq b \leq 0.5$.

(7) A fluorescent substance represented by $M3_{1-a-c}Eu_aCa_cAl_2O_4$ wherein M3 represents at least one element selected from Mg, Ba, Sr and Zn, where $0.0001 \leq a \leq 0.5$ and $0.10 \leq c \leq 0.98$.

(8) A fluorescent substance represented by $M4_{1-a}Eu_aMgAl_{10}O_{17}$ wherein M4 represents at least one element selected from Ca, Ba, Sr and Zn, where $0.0001 \leq a \leq 0.5$.

(9) A fluorescent substance represented by $M4_{1-a}Eu_aMg_{1-b}Mn_bAl_{10}O_{17}$ wherein M4 represents at least one element selected from Ca, Ba, Sr and Zn where $0.0001 \leq a \leq 0.5$ and $0.0001 \leq b \leq 0.5$.

(10) A fluorescent substance represented by $(M1_{1-a}Eu_a)_4Al_{14}O_{25}$ wherein M1 represents at least one element selected from Mg, Ca, Ba, Sr and Zn, where $0.0001 \leq a \leq 0.5$.

(11) A fluorescent substance represented by ZnS:Cu

(12) A fluorescent substance represented by (Zn,Cd)S:Cu, Mn

(13) A fluorescent substance represented by $Re_2O_2S:Eu$ wherein Re represents at least one element selected from Sc, Y, La, Gd and Lu.

In the fourth light emitting device of the present invention, the first fluorescent substance may also include at least a fluorescent substance represented by $(M_{1-a-b}Eu_aL1_b)_{10}(PO_4)_6Q_2$ and one or more fluorescent substance having composition different from that described above, and the second fluorescent substance may be a fluorescent substance based on cerium-activated yttrium aluminum oxide. In the formula described above, M1 represents at least one kind of element selected from Mg, Ca, Ba, Sr and Zn, L1 represents at least one kind of element selected from Mn, Fe, Cr and Sn, and Q represents at least one kind of halogen element selected from F, Cl, Br and I, where $0.0001 \leq a \leq 0.5$ and $0.0001 \leq b \leq 0.5$.

In the fourth light emitting device of the present invention, the first fluorescent substance may also include a fluorescent substance represented by $(M_{1-a-b}Eu_aL1_b)_{10}(PO_4)_6Q_2$ and a fluorescent substance represented by $(M_{1-a}Eu_b)_{10}(PO_4)_6Q_2$, and the second fluorescent substance may be a fluorescent substance based on cerium-activated yttrium aluminum oxide. In the formulas described above, M1 represents at least one kind of element selected from Mg, Ca, Ba, Sr and Zn, L1 represents at least one kind of element selected from Mn, Fe, Cr and Sn, and Q represents at least one kind of halogen element selected from F, Cl, Br and I, where $0.0001 \leq a \leq 0.5$ and $0.0001 \leq b \leq 0.5$.

In the fourth light emitting device of the present invention, the first fluorescent substance may also include a fluorescent substance represented by $(M_{1-a-b}Eu_aL1_b)_{10}(PO_4)_6Q_2$, a fluorescent substance represented by $(M_{1-a}Eu_a)_{10}(PO_4)_6Q_2$ and a fluorescent substance represented by $(M_{1-a}Eu_a)_4Al_{14}O_{25}$, and the second fluorescent substance may be a fluorescent substance based on cerium-activated yttrium aluminum oxide. In the formulas described above, M1 represents at least one kind of element selected from Mg, Ca, Ba, Sr and Zn, L1 represents at least one kind of element selected from Mn, Fe, Cr and Sn, and Q represents at least one kind of halogen element selected from F, Cl, Br and I, where $0.0001 \leq a \leq 0.5$ and $0.0001 \leq b \leq 0.5$.

In the fourth light emitting device of the present invention, the first fluorescent substance may also include a fluorescent substance represented by $(M_{1-a-b}Eu_aL1_b)_{10}(PO_4)_6Q_2$, a fluorescent substance represented by $(M_{1-a}Eu_a)_{10}(PO_4)_6Q_2$, a fluorescent substance represented by $(M_{1-a}Eu_a)_4Al_{14}O_{25}$ and a fluorescent substance represented by $Re_2O_2S:Eu$, and the second fluorescent substance may be a fluorescent substance based on cerium-activated yttrium aluminum oxide. In the formulas described above, $M_1$ represents at least one kind of element selected from Mg, Ca, Ba, Sr and Zn, L1 represents at least one kind of element selected from Mn, Fe, Cr and Sn, Q represents at least one kind of halogen element selected from F, Cl, Br and I, and Re represents at least one element selected from Sc, Y, La, Gd and Lu, where $0.0001 \leq a \leq 0.5$ and $0.0001 \leq b \leq 0.5$.

In the fourth light emitting device of the present invention, the light emitting layer of the light emitting element may also be made of a nitride semiconductor that includes at least In and Ga, or a nitride semiconductor that includes at least Ga and Al. A light emitting element that includes such light emitting layer can emit light in from ultraviolet to visible light of short wavelengths with a high luminance. Also because emission spectrum of the light emitting element can be made narrower, the fluorescent substance can be excited efficiently and the light emitting device can emit light of spectrum having less variation in the color tone. A nitride semiconductor that includes at least In, Al and Ga is also included in the above, as a matter of course.

In the fourth light emitting device of the present invention, an excitation spectrum that is flat over a relatively broad range of wavelengths can be achieved by mixing the fluorescent substances that have different emission spectra, and unevenness in the color tone caused by variability in the emission spectrum of the light emitting element can be improved.

Particularly since the second fluorescent substance can be excited also by the light emitted by the first fluorescent substance that is excited by the semiconductor light emitting element, the light emitting device can provide better color rendering performance. It is also made easier to manufacture the light emitting device with better mass productivity. The fourth light emitting device also allows it to extract components of long wavelengths relatively easily while providing high color rendering performance. Moreover, the light emitting device is capable of emitting white light, providing light of a desired intermediate color with high luminance, and allows delicate adjustment of the color tone.

DETAILED DESCRIPTION OF THE INVENTION

Preferred embodiments of the present invention will be described below.

EMBODIMENT 1

The light emitting device according to the first embodiment of the present invention is constituted by the combination of:

(1) a semiconductor light emitting element that emits light of a wavelength in ultraviolet region; and (2) a fluorescent substance including at least one kind of fluorescent substance (first fluorescent substance) that is excited by ultraviolet rays emitted by the light emitting element and has an emission spectrum having two peaks that are complementary colors of each other, so as to provide the light emitted by the fluorescent substance to the outside.

The light emitting device of the first embodiment having such a constitution as described above is hardly affected by the variability in the emission wavelength of the light emitting element as will be explained later, and the color of the emitted light is determined only by the emission spectrum of the fluorescent substance. Accordingly, such effects can be achieved as less variability in chromaticity, suitability to mass production and reliability that are much higher than in the prior art.

Figure 8:
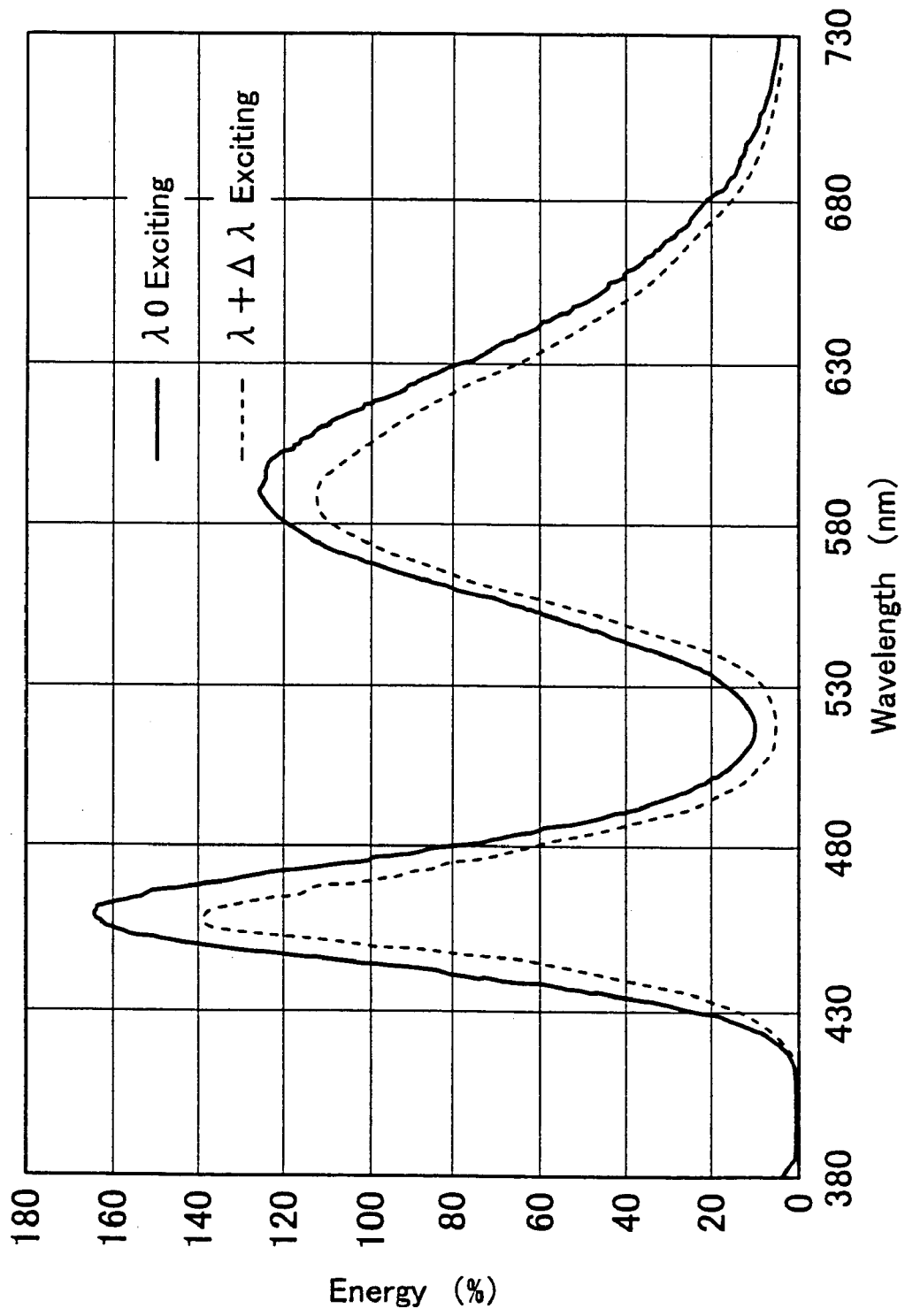
FIG. 8 is a graph schematically showing a change in the emission spectrum of the fluorescent substance when wavelength of light emitted by the semiconductor light emitting element changes.

Specifically, in the light emitting device of the first embodiment, as shown schematically in FIG. 8, even when the emission wavelength of light emitting element that excites the first fluorescent substance changes by Δλ, chromaticity undergoes less variability since intensity ratio between two peaks hardly changes, though the intensity of the emission spectrum may change as a whole.

Therefore, light emitting device of the first embodiment does not show deviation in the chromaticity even when the emission wavelength of the light emitting element varies.

In the light emitting device of the prior art that produces a desired color by mixing the light emitted by a light emitting element and the light emitted by a fluorescent substance, in contrast, since the variability in the emission wavelength of the light emitting element has direct influence on the chromaticity of the light emitting device, light emitted by the light emitting device shows deviation in chromaticity.

In particular, since a semiconductor light emitting element is formed by a process such as MOCVD method, even devices that are produced from the same wafer are subjected to variability that is much larger compared to the variability in the emission spectrum of the fluorescent substance. As a result, a light emitting device that directly utilizes the light emitted by the semiconductor light emitting element may show significant variability.

In case the light emitted by the light emitting element is in ultraviolet region and visible region of extremely low visual sensitivity (for example, wavelengths below 420 nm) as in the case of the first embodiment, chromaticity of the light emitting device is less subject to adverse influence even when the light emitted by the light emitting element is directly output to the outside.

Since the light emitting device according to the first embodiment of the present invention uses the first fluorescent substance that is excited by ultraviolet rays and has an emission spectrum that has two peaks which are complementary colors of each other, variability in chromaticity can be made extremely small.

The light emitting device of the first embodiment can be manufactured with high yield (suited to mass production) since variability in the light emitting elements can be accommodated so as to minimize the variation in the chromaticity.

Moreover, the light emitting device of the first embodiment also has high reliability, since the wavelength of light emitted thereby does not change even when the emission wavelength of the light emitting element changes by aging.

Furthermore, as will be shown by way of Example later, the light emitting device of the first embodiment allows it to control the composition of the fluorescent substance in accordance to the target value of chromaticity, and the color tone can be easily adjusted.

Also as will be described later, light of a color tone that better represent the desired one can be produced, by using an additional fluorescent substance that has an emission peak at a wavelength between those of the two peaks, for example.

Figure 2:
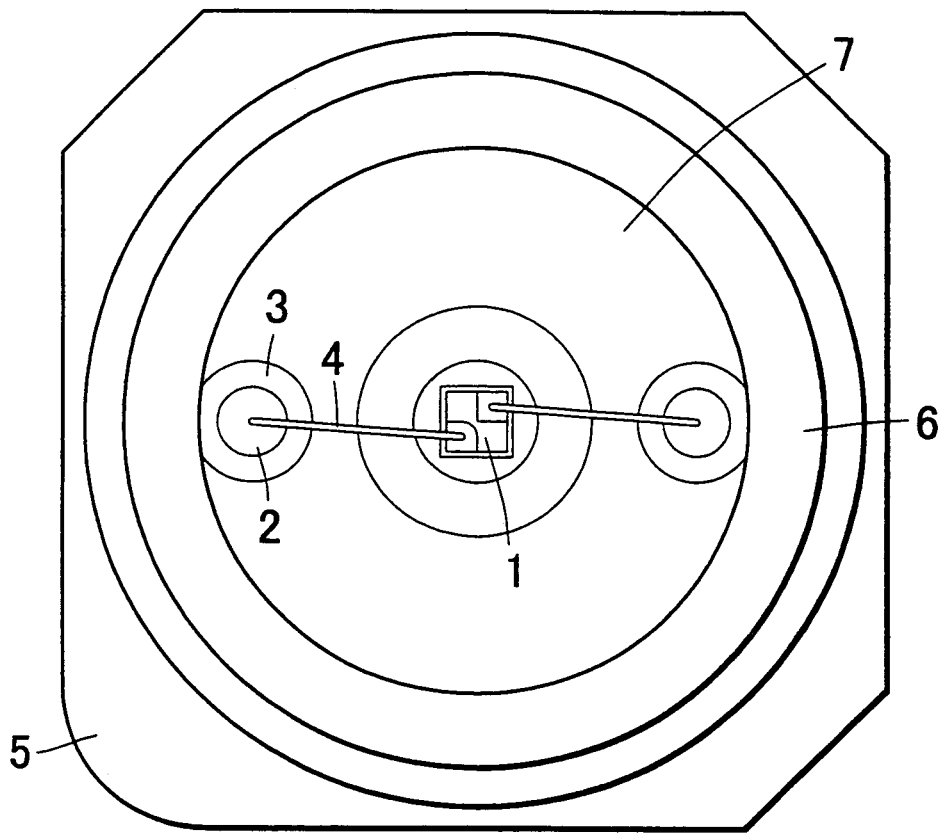
FIG. 2A is a schematic plan view of the light emitting device (surface-mounted light emitting device) according to the first embodiment of the present invention.
FIG. 2B is a schematic sectional view of the light emitting device according to the first embodiment of the present invention.
Figure 2:
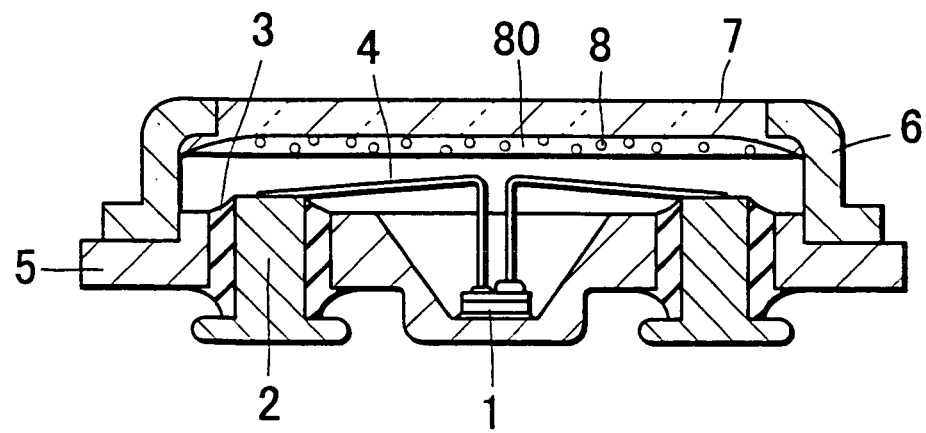
Figure 7:
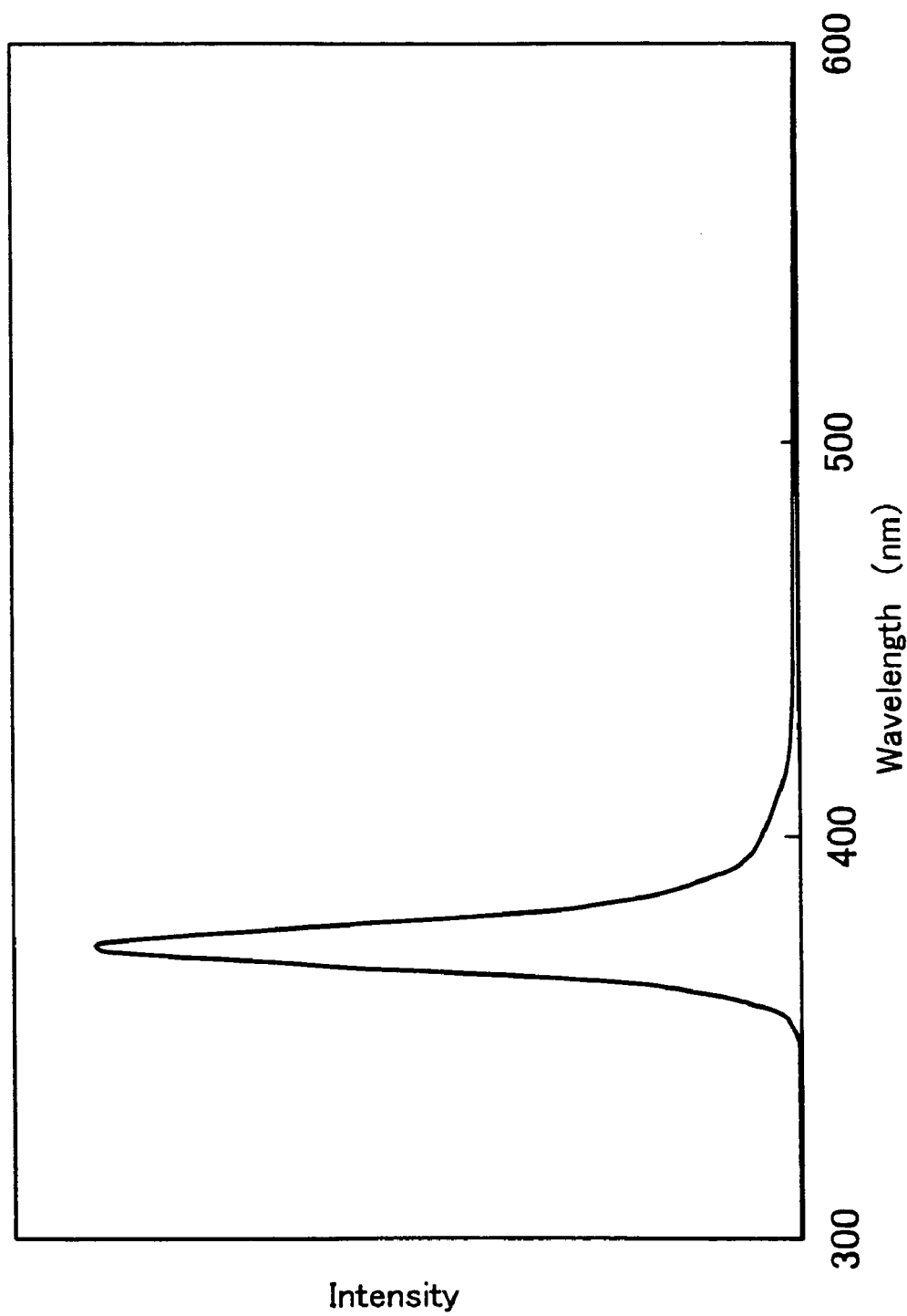
FIG. 7 is a graph showing an Example of emission spectrum of the semiconductor light emitting element used in the light emitting device of the first embodiment of the present invention.

Now specific constitution of the light emitting device of the first embodiment will be described in more detail below with reference to FIG. 2. The light emitting device of the first embodiment is a light emitting device of surface mount type as shown in FIG. 2. The light emitting device of the first embodiment uses a nitride semiconductor light emitting element (LED chip) that has an InGaN light emitting layer of such a composition that emits light with peak intensity at about 370 nm, as a light emitting element, as shown in FIG. 7. The LED chip comprises an n-type GaN layer made of an undoped nitride semiconductor, an Si-doped GaN layer serving as n-type contact layer for forming an n-type electrode, an n-type GaN layer made of an undoped nitride semiconductor, an n-type AlGaN layer made of a nitride semiconductor, an InGaN layer of single quantum well structure serving as a light emitting layer, an AlGaN layer that is an Mg-doped p-type cladding layer and a GaN layer that is an Mg-doped p-type cladding layer, formed one on another on a sapphire substrate. In the first embodiment, a buffer layer is formed on the sapphire substrate by growing a GaN layer at a low temperature in advance, and the p-type semiconductor is changed to p-type by annealing at a temperature of 400° C. or higher after forming the film. In this LED chip, a part of the n-type contact layer surface is exposed by etching on the same side as the p-type contact layer, and a strip of n-type electrode is formed on the exposed n-type contact layer, while a light transmitting p-type electrode made of a thin metal film is formed over substantially the entire surface of the p-type contact layer. Moreover a base electrode is formed on the light transmitting p-type electrode in parallel to the n-type electrode by sputtering process.

In the light emitting device of the first embodiment, a package 5 comprises a base made of Kovar that has a recess at the center thereof to accommodate the LED chip 1, and lead electrodes 2 made of Kovar inserted in through holes 3 formed on both sides of the recess of the base. The lead electrode 2 is provided in the through hole 3 of the base while being insulated from the base made of Kovar by means of an insulating sealing material that also provides hermetic sealing. An Ni/Ag layer is formed on the surfaces of the package 5 and the lead electrode 2. The LED chip 1 is die-bonded by means of Ag—Sn alloy in the recess of the package 5 that is constituted as described above. With this constitution, all constituent members of the light emitting device can all be made of inorganic substances, so that the light emitting device can have dramatically improved reliability even when light emitted by the LED chip 1 is in the ultraviolet region or in the visible light region of short wavelengths.

The electrodes of the LED chip 1 that are die-bonded are electrically connected by means of Ag wires 4 to the lead electrodes 2 that are exposed to the bottom surface of the package base. The light emitting device of the first embodiment is sealed with a lid 6 made of Kovar that has a glass window 7 at the center. The lid 6 made of Kovar and the package base are hermetically sealed by seam welding after fully purging the moisture from the recess of the package 5. A slurry including 90% by weight of nitrocellulose, 10% by weight of γ-alumina and a fluorescent substance 8 is applied to the inside of the glass window 7 of the lid 6 made of Kovar, and is hardened by heating at 220° C. for 30 minutes so as to form a color conversion member 80 in advance.

According to the first embodiment, various fluorescent substances to be described later can be used.

The light emitting device (light emitting diode) of the first embodiment having such a constitution as described above is capable of emitting white light with a high luminance.

Figure 1:
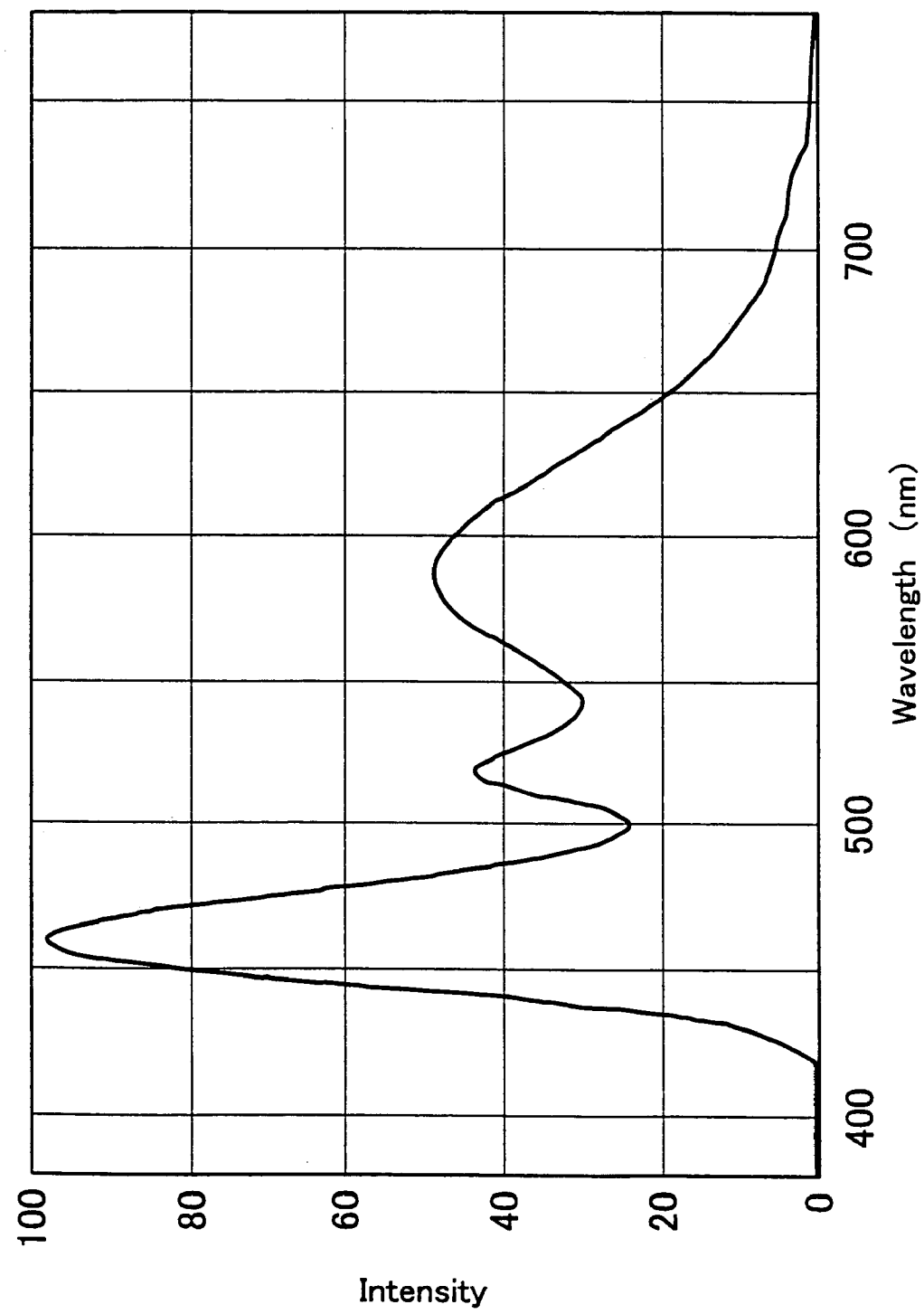
FIG. 1 is a graph showing an example of an emission spectrum of the light emitting device according to the first embodiment of the present invention.

In case alkali earth metal chlor-apatite fluorescent substance activated with Eu including at least Mn (first fluorescent substance) $(Sr_{0.96}, Eu_{0.01}, Mn_{0.08})_{10}(PO_4)_6Cl_2$ and $SrAl_2O_4$:Eu fluorescent substance, for example, are used as the fluorescent substance 8 in the first embodiment, the light emission characteristic shown in FIG. 1 is obtained.

The peak at wavelength of about 460 nm and the peak at wavelength of about 580 nm shown in FIG. 1 are the peaks of emission by $(Sr_{0.96}, Eu_{0.01}, Mn_{0.08})_{10}(PO_4)_6Cl_2$ fluorescent substance that have relationship of complementary colors of each other. Emission around 520 nm shows the spectrum of emission by $SrAl_2O_4$:Eu. In this example, the desired chromaticity is approximately achieved by means of the $(Sr_{0.96}, Eu_{0.01}, Mn_{0.08})_{10}(PO_4)_6C$ that has the two emission peaks, and the chromaticity is adjusted by means of the $SrAl_2O_4$:Eu fluorescent substance that is a green fluorescent substance to compensate for the lack of green shade, thereby making the chromaticity nearer to that desired.

Thus the light emitting device of this Example can minimize the variability in chromaticity by using the first fluorescent substance that has two emission peaks and very easily control the chromaticity by using the second fluorescent substance, so that the devices of high reliability can be favorably mass produced.

Now the constitution of the light emitting device according to the first embodiment will be described below.

(Semiconductor Light Emitting Element)

For the semiconductor light emitting element of the present invention, a semiconductor light emitting element that has a light emitting layer capable of emitting light of such a wavelength that can efficiently excite the fluorescent substance is used.

Such a semiconductor light emitting element may be made of various semiconductor materials such as BN, SiC, ZnSe, GaN, InGaN, InAlGaN, AlGaN, BaIGaN and BinAlGaN. Any of these materials may also be complemented with an impurity element such as Si or Zn as luminescence center. As a material for light emitting layer that can emit light efficiently in a region from ultraviolet to visible light of short wavelengths for efficiently excite the fluorescent substance, nitride semiconductors (for example, $In_XAl_YGa_{1-X-Y}N$, $0 \leq X$, $0 \leq Y$, $X+Y \leq 1$) for nitride semiconductor including Al and/or Ga, and nitride semiconductor) are particularly suitable.

The semiconductor light emitting element may be constituted in homojunction structure that has MIS junction, PIN junction or pn junction, heterojunction structure or double heterojunction structure. Emission wavelength of the semiconductor material can be controlled so as to match the excitation wavelength of the fluorescent substance by adjusting the composition of mixed crystal. Output power can be increased by forming the active layer in single quantum well structure or multiple quantum well structure.

When the light emitting element is made of a nitride semiconductor, the substrate can be made of sapphire, spinel, SiC, Si, ZnO, GaAs or GaN. In order to form the nitride semiconductor with good crystallinity and characteristic suitable for mass production, it is preferable to use a sapphire substrate. The nitride semiconductor can be formed on the sapphire substrate by the HVPE process, MOCVD process or the like. It is more preferable to form the nitride semiconductor that has pn junction on a buffer layer that is not a single crystal and is formed on the sapphire substrate by growing GaN, AlN, GaAlN or the like at a low temperature.

A light emitting element of double heterojunction structure made in a procedure described below mat be used as an Example of light emitting element that is made of a nitride semiconductor and can efficiently emit light in the ultraviolet region.

First, a buffer layer is formed on the sapphire substrate, and an $SiO_2$ layer is formed in stripe pattern on the buffer layer at substantially right angles to the orientation flat plane of the sapphire substrate.

Then a GaN layer of ELOG (Epitaxial Lateral Over Growth GaN) is formed on the stripe by the HVPE method.

Then a first contact layer made of n-type gallium nitride, a first cladding layer made of n-type aluminum gallium nitride, an active layer of multiple quantum well structure consisting of a plurality of well layers made of indium aluminum gallium nitride and barrier layers made of aluminum gallium nitride formed one on another, a second cladding layer made of p-type aluminum gallium nitride and a second contact layer made of p-type gallium nitride stacked in this order.

The p-type layer is etched so as to expose a part of the n-type contact layer surface, and electrodes are formed on the p-type and n-type contact layers, followed by the separation of individual chip, thus making the LED chips.

With this constitution, the active layer can be formed in a ridge stripe pattern sandwiched by guide layers with a resonator end face being provided, so as to make a semiconductor laser element that can be used in the present invention.

The nitride semiconductor shows n-type conductivity when not doped with an impurity. However, since it is necessary to control the concentration of a desired carrier to a predetermined value, it is preferable to introduce Si, Ge, Se, Te, C or the like as n-type dopant in order to form the n-type nitride semiconductor. When a p-type nitride semiconductor is formed, on the other hand, the semiconductor is doped with Zn, Mg, Be, Ca, Sr, Ba or the like as p-type dopant. At this time, since it is difficult to turn the nitride semiconductor into p-type simply by doping with a p-type dopant, it is preferable to decrease the resistivity by heating in a furnace or plasma irradiation after introducing the p-type dopant.

n the semiconductor light emitting element used in the present invention, sheet resistance of the n-type contact layer formed with impurity concentration in a range from $10^{17}$ to $10^{20}$/cm$^3$ and sheet resistance of the light transmitting p electrode are preferably controlled to satisfy the relationship of $Rp \geq Rn$. The n-type contact layer is formed to a thickness of preferably from 3 to 10 μm, more preferably from 4 to 6 μm. As the sheet resistance of the n-type contact layer is estimated at 10 to 15 Ω/□, the thin film is preferably formed so that the sheet resistance Rp is not less than the value described above. The light transmitting p electrode may also be formed in a thin film having thickness of 150 Å or less.

In case the light transmitting p electrode is formed from a multi-film layer, made of one kind of metal selected from a group consisting of gold and platinum group elements and at least one kind of other metal, or an alloy, then stability and reproducibility can be improved by controlling the content of gold or platinum group element thereby to regulate the sheet resistance of the light transmitting p electrode. Since gold or the other metal element has a high absorptivity in the wavelength region of the semiconductor light emitting element that is used in the present invention, the transmittance becomes higher when the light transmitting p electrode includes less gold or platinum group element. The semiconductor light emitting element of the prior art has the relation of Rp≧Rn for the sheet resistances. Since Rp≧Rn holds according to the present invention, the light transmitting p electrode is formed with smaller thickness than in the prior art, the thickness can be decreased easily by reducing the content of gold or the other metal element.

In the semiconductor light emitting element used in the present invention, as described above, sheet resistance Rn Ω/□ of the n-type contact layer and sheet resistance Rp Ω/□ of the light transmitting p electrode are preferably controlled to satisfy the relationship of Rp≧Rn. It is difficult to measure the value of Rn after making the semiconductor light emitting element, and it is virtually impossible to know the relationship between Rp and Rn. Although the relationship between Rp and Rn can be estimated from the light intensity distribution during emission.

A p-side base electrode is formed on a part of the light transmitting p electrode that is formed over substantially the entire surface of the p-type contact layer.

Preferable arrangement of the electrodes according to the present invention will be described below with reference to FIG. 13 to FIG. 16.

Figure 13:
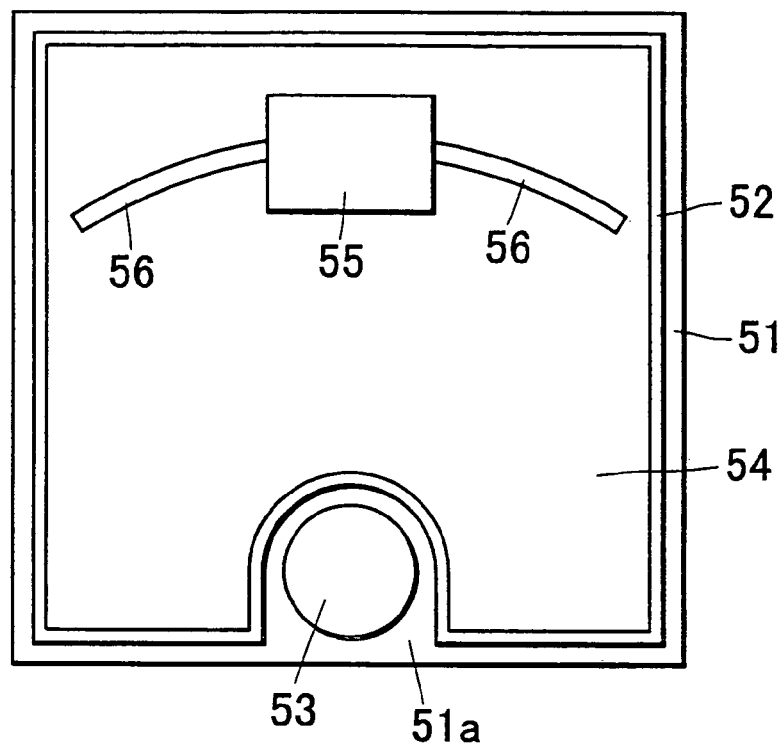
FIG. 13 is a plan view showing the configuration of electrodes of the semiconductor light emitting element used in the first embodiment of the present invention.
Figure 14:
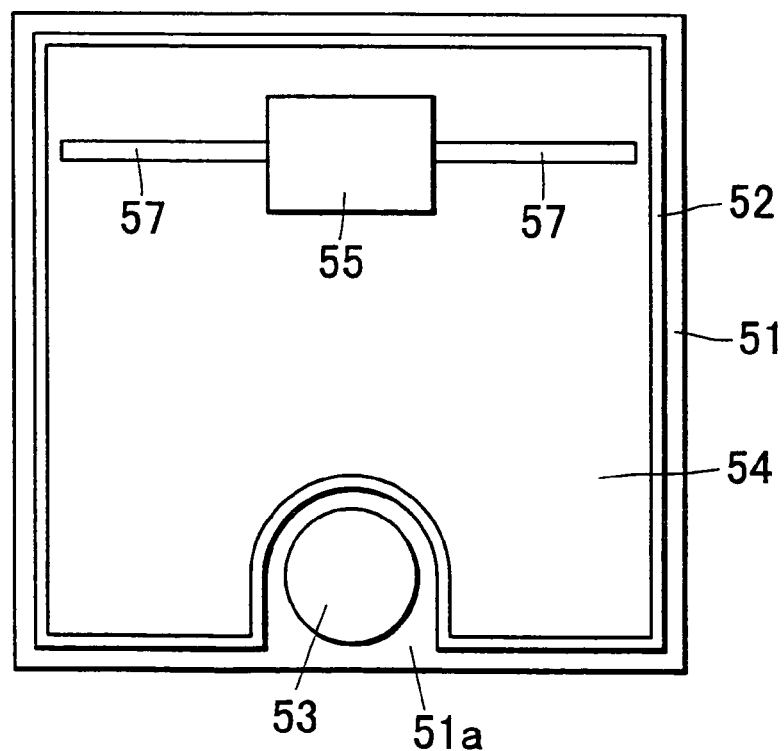
FIG. 14 is a plan view showing a configuration of electrodes different from that in FIG. 13 in the semiconductor light emitting element of the first embodiment.

In the light emitting element of the present invention, an n electrode 53 is disposed in the vicinity of at least one side of the semiconductor light emitting element, as shown in FIG. 13 and FIG. 14. In the Example shown in FIG. 13 and FIG. 14, a part of the p-type layer and a part of the active layer are removed by etching in the middle portion of the one side so as to provide a notch 51a where the n-type contact layer 51 is exposed, and the n electrode 53 is formed in the notch 51a.

The p-side base electrode 55 is formed at a position adjacent to the side that opposes the side in the vicinity of which the n electrode is disposed in the light transmitting p electrode 54. An extension conductor 56 on two lines are connected to the p base electrode 55, the extension conductors 56 extending along the side in the vicinity of which the base electrodes 55 on both sides. According to the present invention, as the p-side base electrode 55 and the n electrode 53 are formed in the positional relationship described above, the active layer disposed between the p-side base electrode 55 and the n electrode 53 can be caused to emit light with high efficiency. Moreover, current can be effectively diffused throughout the p layer by forming the extension conductor 56 that is connected to the p-side base electrode 55 so as to have electrical continuity on the light transmitting p electrode 54, so that the light emitting layer emits light efficiently as a whole.

Also it has been confirmed by the present inventors that light is emitted with high luminance in the portion around the extension conductor 56 and the p-side base electrode 55.

According to the present invention, therefore, it is more preferable to effectively utilize the light emitted with high luminance in the portion around the extension conductor 56.

Specifically, in order to secure the peripheral portion that emits light with high luminance between the extension conductor 56 and the edges of the light emitting layer and the p layer along which the extension conductor 56 is formed, it is preferable to keep a space between the edge and the extension conductor 56. When sheet resistance Rn Ω/□ of the n-type contact layer and sheet resistance Rp Ω/□ of the light transmitting p electrode 54 satisfy the relationship of Rp≧Rn, the space between the extension conductor 56 and the edge of the light emitting layer is preferably from 20 µm to 50 µm. When the space is less than 20 µm, the peripheral portion that emits light with high luminance cannot be secured (the region that should emit light with high luminance extends to the outside). When the space is larger than 50 µm, a portion that emits light with low luminance is formed along the adjacent side, leading to a low luminance as a whole.

The extension conductors 56 is preferably formed in an arc shape so as to be equi-distanced from the n electrode 53 as shown in FIG. 13, which results in more uniform light intensity distribution than in a case of forming the extension conductors 56 in a straight configuration as shown in FIG. 14.

Moreover, according to the present invention, it is more preferable that the n electrode 63 is located at one corner of the semiconductor light emitting element near two sides, and the base electrode is located at a corner diagonally opposite to the corner near which the n electrode 63 is located.

Figure 15:
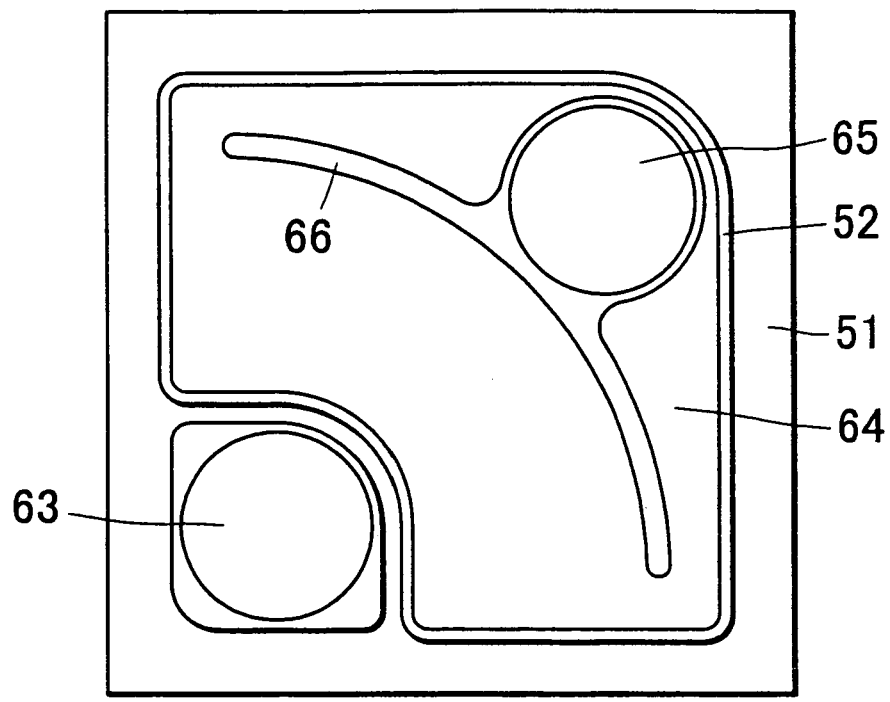
FIG. 15 is a plan view showing a preferable configuration of electrodes of the semiconductor light emitting element used in Example 1.
Figure 16:
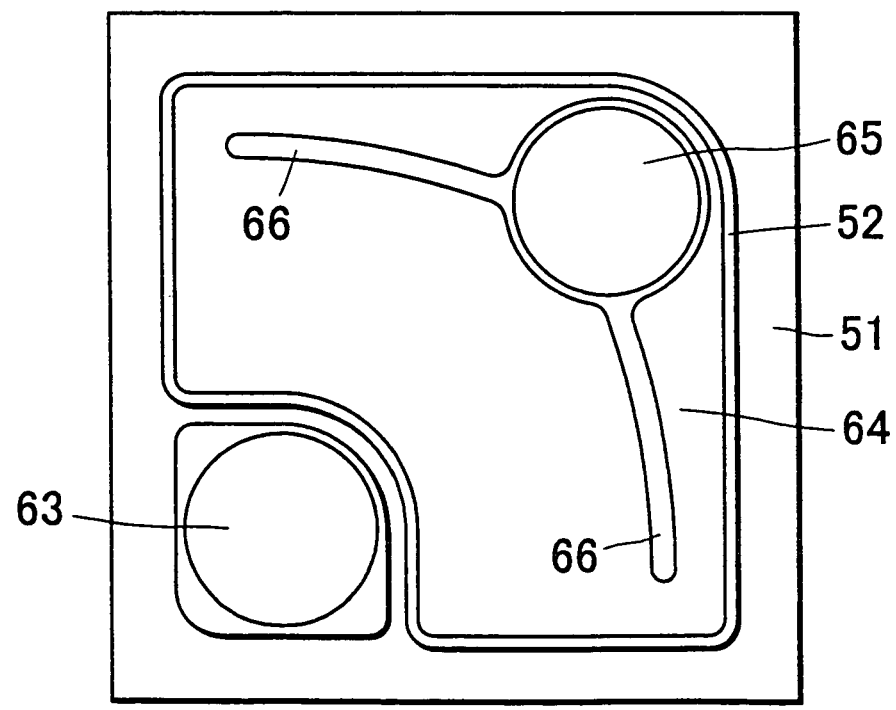
FIG. 16 is a plan view showing a configuration of electrodes in a variation shown in FIG. 15 of the semiconductor light emitting element used in the first embodiment.

In case the n electrode 63 and the p-side base electrode 65 are disposed diagonally opposite to each other, too, the extension conductors 66 are preferably formed in an arc shape so as to be equi-distanced from the n electrode 63 as shown in FIG. 15 and FIG. 16, which makes it possible to emit light with higher luminance and higher uniformity.

The space between the extension conductor 66 and the edge of the light emitting layer is preferably from 20 µm to 50 µm, in order to secure the region where light is emitted with high luminance, as mentioned previously.

The light emitting device of the present invention is preferably made of a resin for the purpose of mass production. In this case, when considering the wavelength of light emitted by the fluorescent substance and degradation of the light transmitting resin, it is preferable that the light emitting element emits light in ultraviolet region with peak wavelength in a range from 360 to 420 nm, more preferably from 370 to 410 nm. In order to further improve the excitation and light emission efficiencies of the light emitting element and the fluorescent substance, the peak wavelength is more preferably in a range from 380 to 400 nm.

(Fluorescent Substance 8)

While the light emitting device of the first embodiment uses the fluorescent substance that can be excited by the light emitted by the semiconductor light emitting element and efficiently emit light of wavelengths different from that of the excitation light is used, a fluorescent substance of which excitation region includes ultraviolet region is preferably used in the first embodiment. Also in the first embodiment, the fluorescent substance includes the first fluorescent substance that absorbs at least a part of the light emitted by the semiconductor light emitting element of wavelengths longer than 360 nm in the ultraviolet region, and emit light of spectrum having two or more emission peaks. At least two of the two or more emission peaks of the first fluorescent substance are preferably complementary colors of each other. Moreover, one of the two emission peaks of the first fluorescent substance that are complementary colors of each other is the largest emission peak of the emission spectrum and the other peak has an intensity of 50% of the largest emission peak or more. Furthermore, either one of the two emission peaks that are complementary colors of each other preferably includes red component. Specifically, a fluorescent substance that satisfies the requirements described above is, for example, alkali earth metal halogen-apatite fluorescent substance activated with Eu that includes at least Mn and/or Cl.

The fluorescent substance can be prepared by a process described below. First, phosphate oxide that is a component of the fluorescent substance or a compound that can turn into the oxide through thermolysis and ammonium chloride are weighed and mixed in a ball mill or the like. The mixed material is put into a crucible and is fired in reducing atmosphere of $N_2$ or $H_2$ at a temperature from 800 to 1200° C. for 3 to 7 hours. The fired material is crushed in a wet process, sieved, dehydrated and dried thereby to obtain the alkali earth metal halogen-apatite fluorescent substance.

According to the present invention, alkali earth metal halogen-apatite fluorescent substance represented by general formula $(M_{1-x-y}Eu_xM'_y)_{10}(PO_4)_6Q_2$ (M represents at least one kind of element selected from Mg, Ca, Ba, Sr and Zn, M' represents at least one kind of element selected from Mn, Fe, Cr, Sr and Zn, and Q represents at least one kind of halogen element selected from F, Cl, Br and I). In this case, the proportion x of the first activation element Eu in the general formula described above is preferably in a range from $0.0001 \leq x \leq 0.5$. This is because the luminance of light emitted becomes lower when the value of x is less than 0.0001, the luminance of emission tends to decrease due to concentration optical quenching when the value of x is larger than 0.5. Value of x is more preferably in a range of $0.005 \leq x \leq 0.4$, and further more preferably in a range of $0.01 \leq x \leq 0.2$.

In the general formula described above, y is the proportion of at least one kind of element selected from Mn, Fe, Cr and Sn. The value of y is preferably in a range from $0.0001 \leq y \leq 0.5$, more preferably in a range of $0.005 \leq y \leq 0.4$, and further more preferably in a range of $0.01 \leq y \leq 0.3$. The luminance of emission tends to decrease due to concentration optical quenching when the value of y is larger than 0.5.

The fluorescent substance emits visible light from blue, white (for example, white color specified in JIS Z8110 or white color that is basic color of systematic color chart) to red color when excited by irradiation in a region ranging from ultraviolet to visible light of short wavelengths (for example, light of main wavelength not longer than 440 nm).

In particular, since the alkali earth metal halogen-apatite fluorescent substance described above can be efficiently excited also by ultraviolet rays of relatively long wavelengths around 365 nm so as to emit light with high luminance that also includes red component, good color rendering performance can be achieved with mean color rendering index Ra of 80 or higher.

Figure 3:
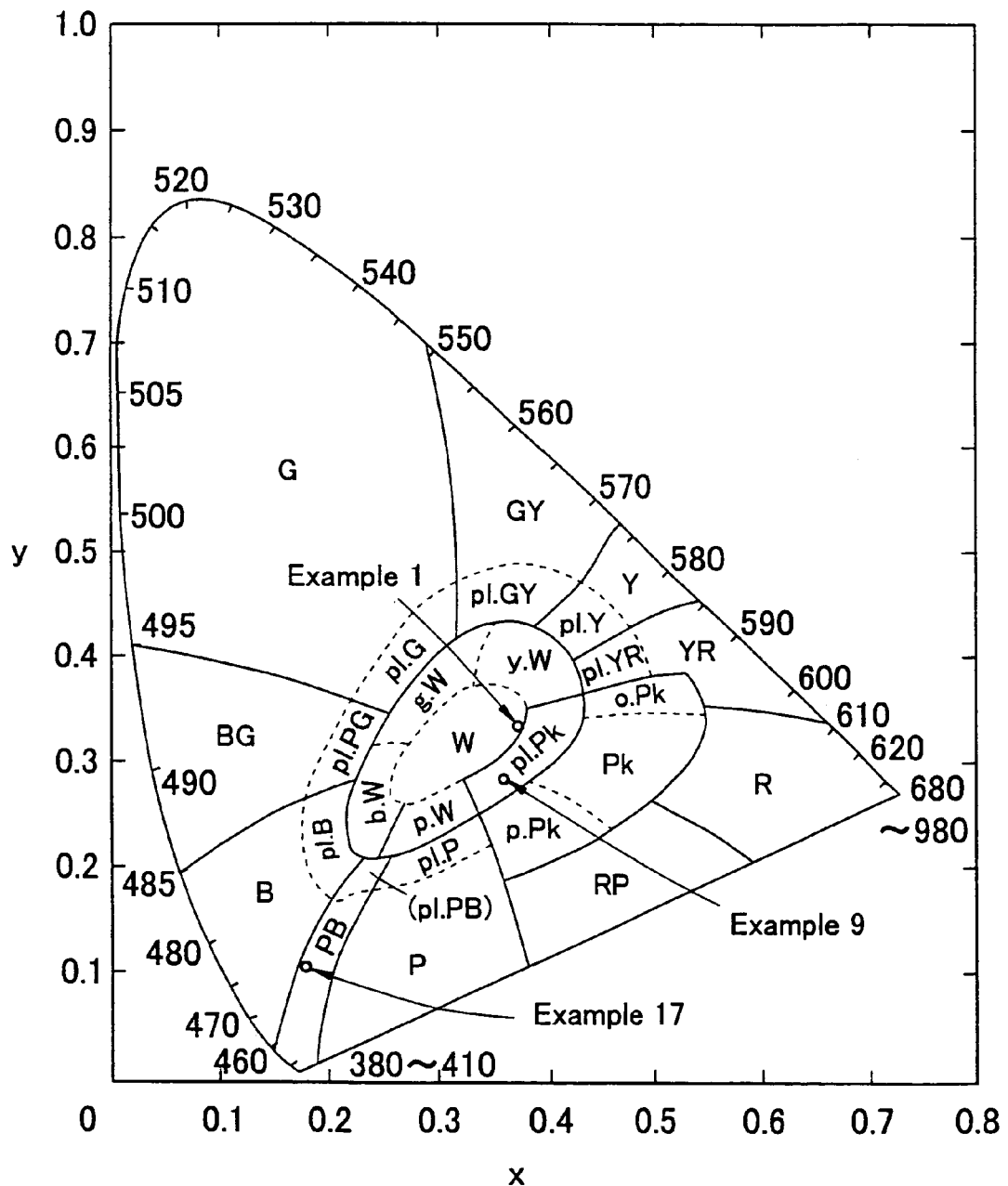
FIG. 3 is a chromaticity chart of CIE showing the chromaticity of the light emitting devices of Examples 1, 9 and 17 of the present invention.

The CIE chromacity chart of FIG. 3 shows the colors of light emitted by the fluorescent substances that are used in the first, ninth and seventeenth embodiments to be described later, excited by light having wavelength of 365.5 nm. It can be seen from FIG. 3 that color tone can be controlled from blue, white to red by changing the composition of the fluorescent substance used in the first embodiment.

When Sr is used as the element M, blue light is emitted by $Eu^{2+}$ that has a peak of emission at around 450 nm, while the color of light emitted by the fluorescent substance changes from blue, white to red due to the emission by Mn, as the value of y is increased for the proportion of M' that is Mn. While similar changes are observed depending on the proportions of Eu and Mn also in case Ca is used as M, emitted light undergoes less changes in case Ba is used as M.

Figure 4:
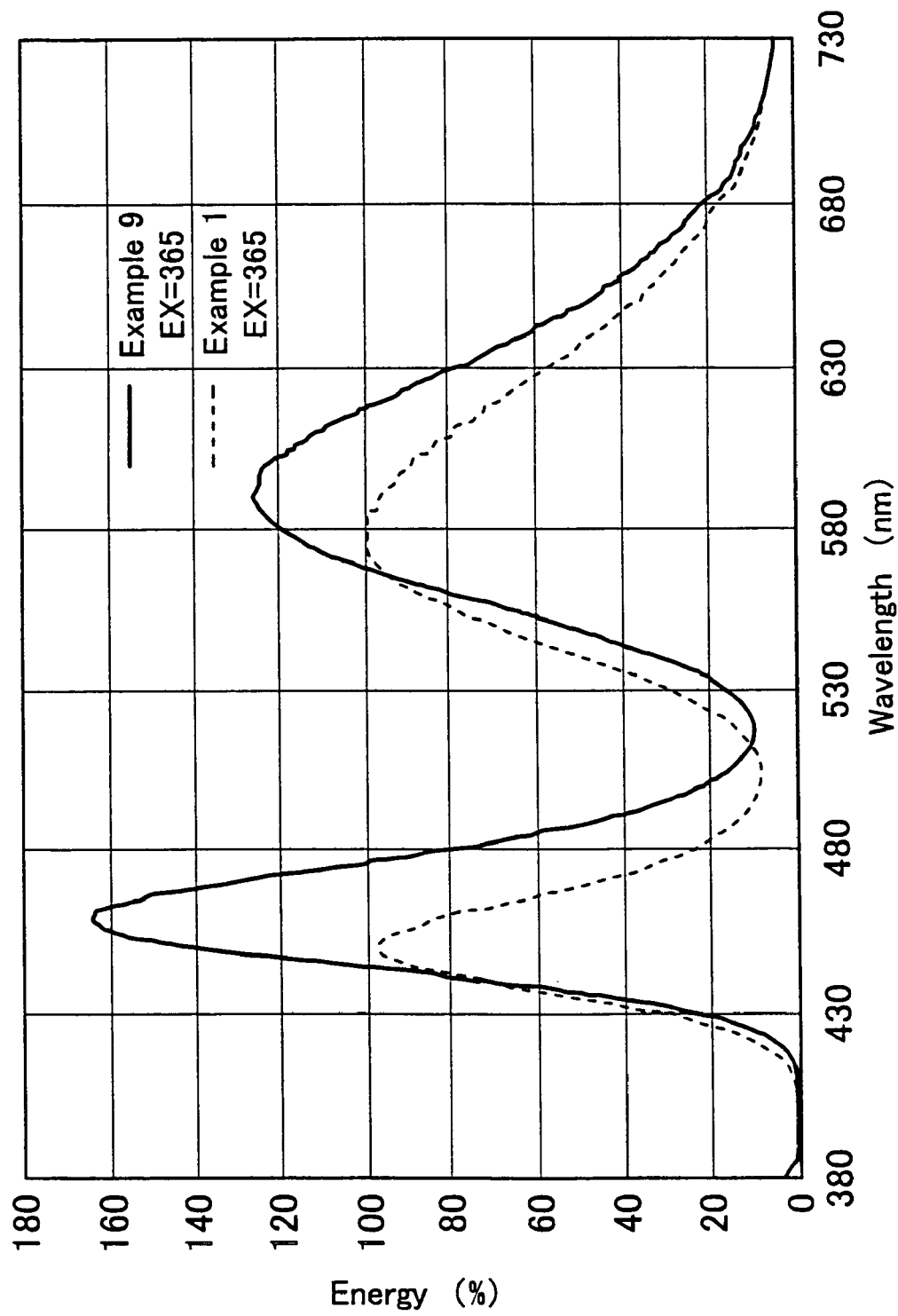
FIG. 4 is a graph showing the emission spectrum of fluorescent substance used in Example 1 (dashed line) and in Example 9 (solid line) when excited by light of 365 nm.
Figure 5:
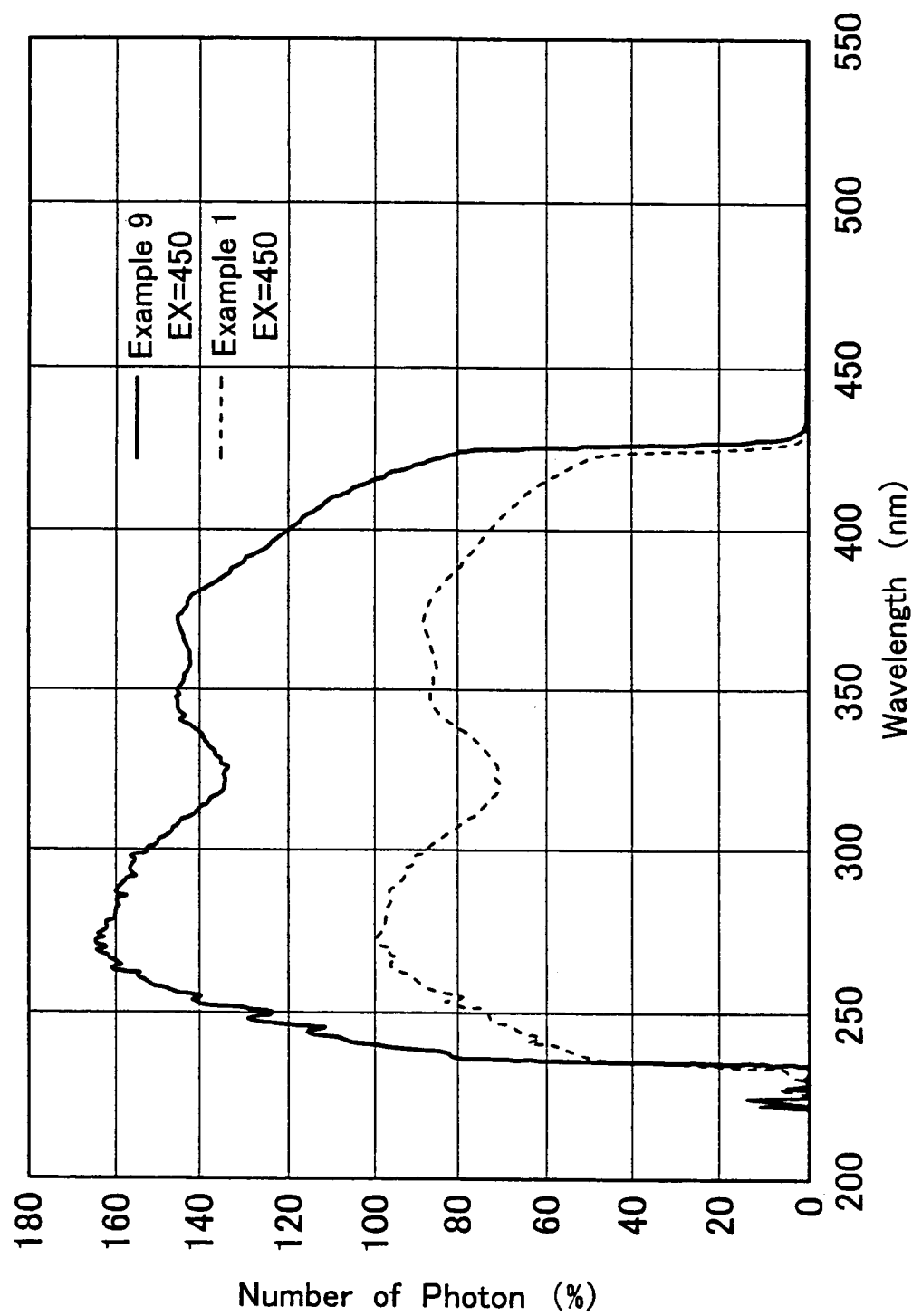
FIG. 5 is a graph showing the emission spectrum of fluorescent substance used in Example 1 (dashed line) and Example 9 (solid line) when excited by light of 450 nm.
Figure 6:
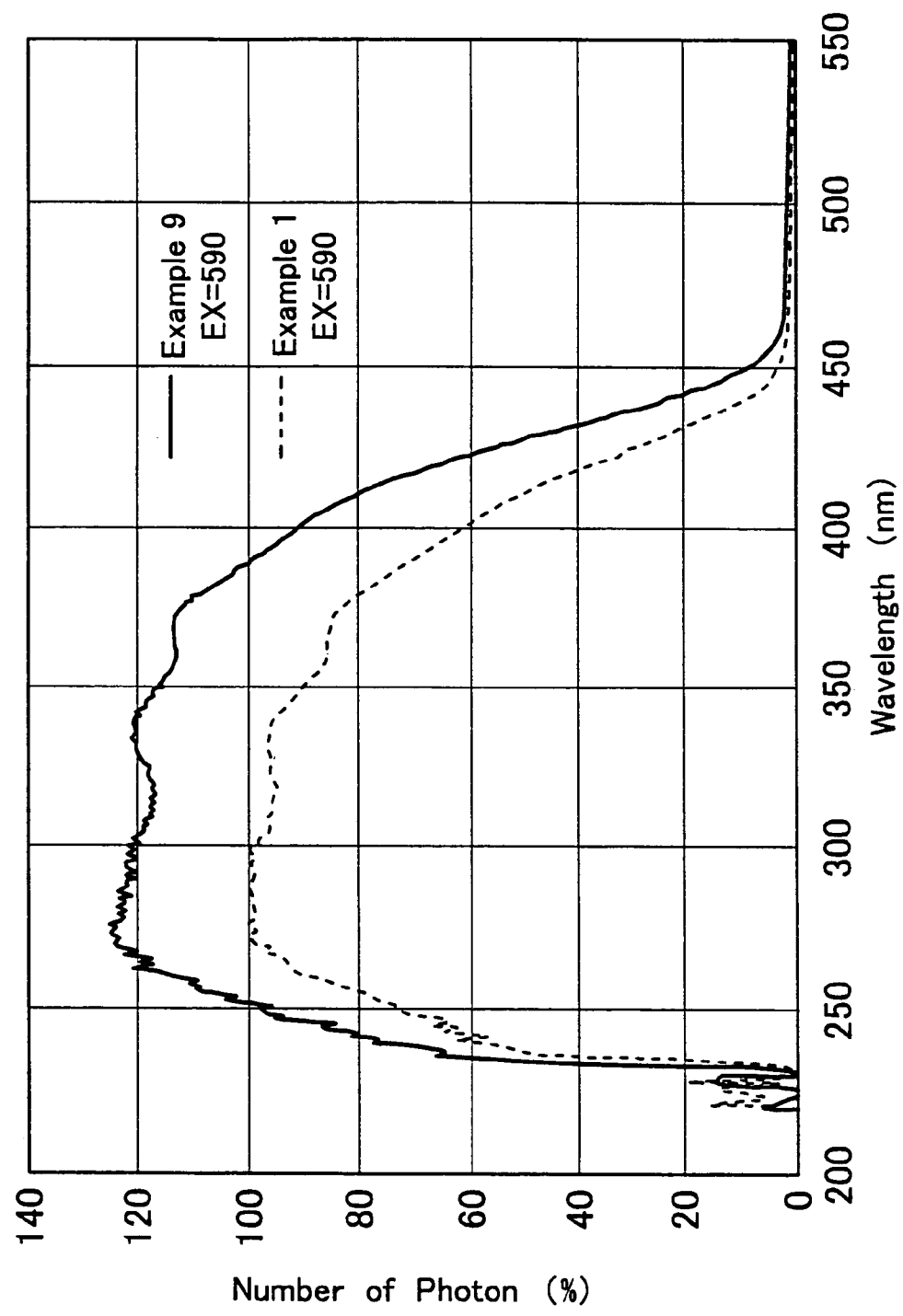
FIG. 6 is a graph showing the emission spectrum of fluorescent substance used in Example 1 (dashed line) and Example 9 (solid line) when excited by light of 590 nm.

Dashed line in FIG. 4 shows the emission spectrum of the fluorescent substance used in the first embodiment when excited with light of 365 nm, dashed line in FIG. 5 shows the emission spectrum of the fluorescent substance used in Example 1 when excited with light of 450 nm, and dashed line in FIG. 6 shows the emission spectrum of the fluorescent substance used in the first embodiment when excited with light of 590 nm. From FIG. 6, it can be seen that the fluorescent substance used in the present invention is efficiently excited with light in a region ranging from near ultraviolet to visible light of relatively short wavelengths (for example, from 230 or 300 nm to 400 or 425 nm), and the emitted light belongs to a region identified as basic color of white in JIS Z8110. This fluorescent substance is excited efficiently by any light in the entire ultraviolet region, and is therefore expected to be used effectively for excitation with short wavelength ultraviolet.

Solid line in FIG. 4 shows the emission spectrum of the fluorescent substance used in Example 9 when excited with light of 365 nm. It can be seen that the fluorescent substance used in the ninth embodiment has a relatively broad emission spectrum with peaks at about 460 nm and about 600 nm.

Solid line in FIG. 5 shows the emission spectrum of the fluorescent substance used in Example 9 when excited with light of 460 nm, and solid line in FIG. 6 shows the emission spectrum of the fluorescent substance used in Example 9 when excited with light of 600 nm.

A light emitting device that uses this fluorescent substance can emit light with emission spectrum that has peaks at about 460 nm and about 580 nm, upon excitation by light emitted by an ultraviolet LED or an ultraviolet LD. The component of wavelength around 460 nm and the component of wavelength around 580 nm in this emission spectrum are complementary colors of each other. According to the present invention, color rendering performance can be improved further by adding $SrAl_2O_4$:Eu that is a green light emitting fluorescent substance to alkali earth metal halogen-apatite fluorescent substance activated with Eu that includes at least Mn and/or Cl.

In addition to Eu, one kind selected from Tb, Cu, Ag, Au, Cr, Nd, Dy, Co, Ni and Ti may be included in the fluorescent substance as required.

Particle size of the fluorescent substance is preferably controlled in a range from 1 to 100 μm, more preferably in a range from 5 to 50 μm. Furthermore preferable range is from 10 to 30 μm. The fluorescent substance having particle sizes less than 10 μm is relatively more prone to coagulation. Light absorptivity and conversion efficiency of the fluorescent substance can be improved and the bandwidth of excitation light can be increased by controlling the particle size within the range described above. Thus use of the fluorescent substance of large particle size that has better optical characteristics makes it possible to emit light by efficiently converting the light of wavelengths around the peak wavelength of the light emitting element, and also improve the mass productivity of the light emitting device because coagulation can be prevented.

The particle size referred to herein is represented by a value determined from volumetric particle size distribution curve. The volumetric particle size distribution curve is obtained by measuring the particle size distribution by laser diffraction and diffusion method. Specifically, the fluorescent substance is dispersed in an aqueous solution of sodium hexametaphosphate of 0.05% concentration at ambient temperature of 25° C. and humidity of 70%, and a laser diffraction particle size distribution measuring instrument (SALD-2000A) is used to measure in a range from 0.03 μm to 700 μm. Medium particle size refers to the particle size of 50 percentile value of the volumetric particle size distribution curve. The fluorescent substance of the present invention can emit light with high luminance since the median particle size in set in a range from 15 μm to 50 μm.

According to the present invention, it is preferable that a higher proportion of the fluorescent substance having the median particle size described above is included, with the proportion being preferably from 20% to 50%. By using the fluorescent substance having less variability in the particle sizes, color unevenness can be minimized and a light emitting device having satisfactory color tone can be obtained.

EMBODIMENT 2

The light emitting device according to the second embodiment of the present invention will now be described below.

The light emitting device of the second embodiment is constituted in the same manner as in the first embodiment, except for using the fluorescent substance that is different from that of the first embodiment.

The light emitting device of the second embodiment emits light with less color deviation by taking advantage of the fact that the bandwidth of blurred light emitted by the fluorescent substance upon excitation by the light emitting element is less than the bandwidth of blurred light emitted by the light emitting element While the semiconductor light emitting element is formed by the MOCVD or other process, some variability occur even among chips that are produced from a same wafer. As a result, a light emitting device that outputs the light emitted by the semiconductor light emitting element tends to produce very large variability. The light emitting device of the second embodiment has been completed upon finding the fact that variability in the wavelength of light emitted by the light emitting element can be absorbed by a fluorescent substance to be described later, in case the light emitting element having emission spectrum in a region ranging from ultraviolet rays to visible region of extremely low visual sensitivity (for example, wavelengths below 420 nm) is used.

Figure 9:
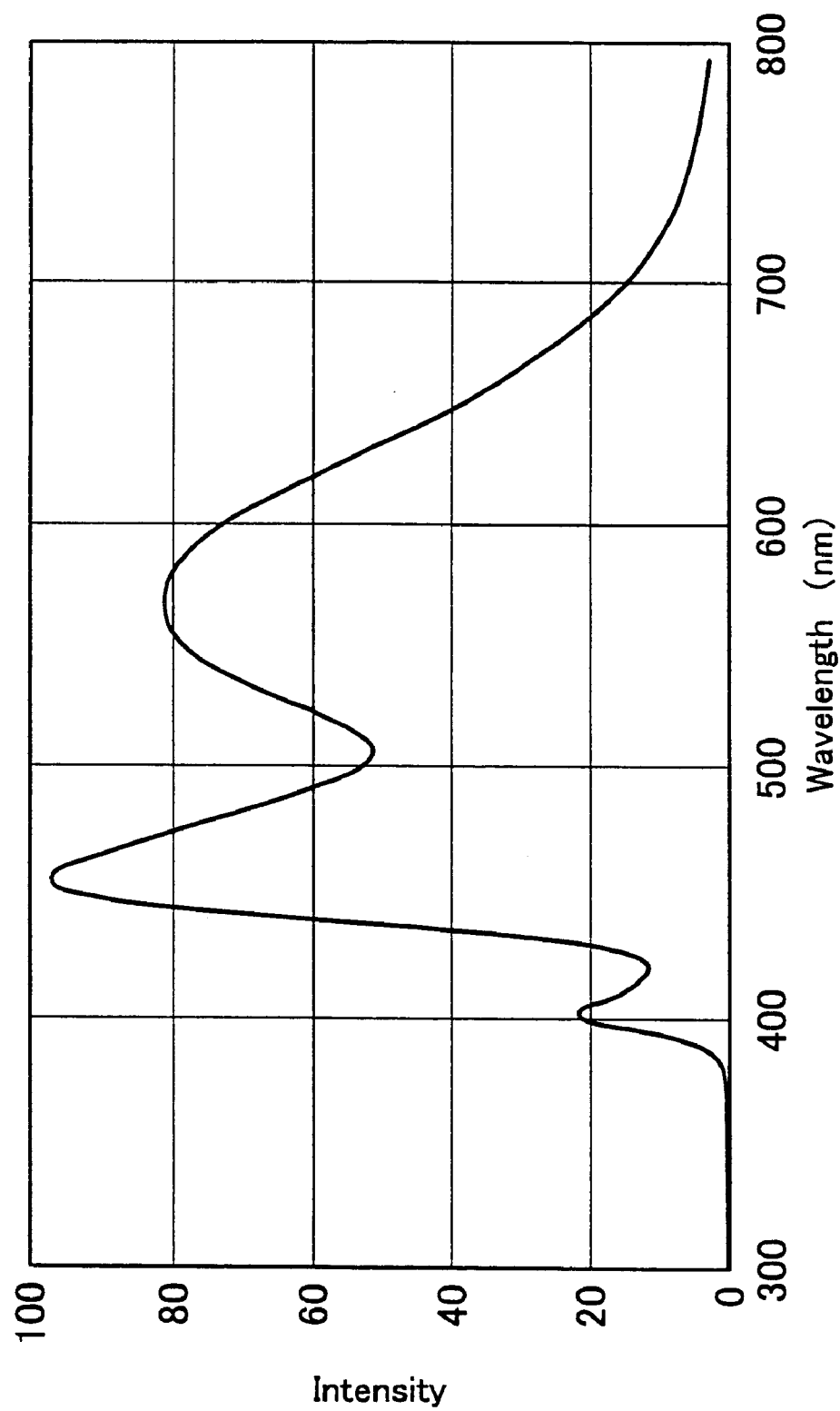
FIG. 9 is a graph showing an Example of emission spectrum of the light emitting device of the second embodiment according to the present invention.

Specifically, the light emitting device of the second embodiment has a first fluorescent substance that is excited by the semiconductor light emitting element and a second fluorescent substance that has a different emission spectrum from those of the first fluorescent substance and the semiconductor light emitting element. This constitution makes it possible to suppress the variability in the wavelength of the emitted light and emit light with better color rendering performance. In the light emitting device of the second embodiment, two fluorescent substances provide two or more peaks of emission as shown in FIG. 9, so that deviation in the color tone of light emitted by the fluorescent substance can be minimized and deviation in the color tone of light emitted by the light emitting device can be suppressed. In the light emitting device of the second embodiment, it is preferable that at least two of the two or more peaks of the emission spectrum of the fluorescent substance are complementary colors of each other, which allows it to minimize the deviation in the color tone of light emitted by the fluorescent substance and suppress the deviation in the color tone of light emitted by the light emitting device. As the second fluorescent substance is excited by the light emitted by the first fluorescent substance, stable light with further reduced color deviation can be emitted. This effect is achieved supposedly because the second fluorescent substance is excited by the light having less variability emitted by the first fluorescent substance that is excited by the semiconductor light emitting element, thereby achieving the stable light emitting device that has less color deviation.

Also by using two or more kinds of fluorescent substances as in the case of the second embodiment, it is made easier to control the color tone of the light emitting device so that, for example, deviation in color tone can be suppressed by using additional fluorescent substance that has another peak between the two peaks of the emission spectrum that are complementary colors to each other.

Now the fluorescent substance used in the light emitting device of the second embodiment will be described in more detail below.

(Fluorescent Substance)

The fluorescent substance used in the light emitting device of the second embodiment comprises the first fluorescent substance that can efficiently emit light when excited by the light emitted by the semiconductor light emitting element, and the second fluorescent substance that has an emission spectrum different from those of the first fluorescent substance and the semiconductor light emitting element. The second fluorescent substance may also be a fluorescent substance that can emit light upon excitation by the first fluorescent substance. Although each of the first fluorescent substance and the second fluorescent substance can be used individually, the light emitting device of excellent color rendering performance is made by using both the first fluorescent substance and the second fluorescent substance in the second embodiment. Therefore, the fluorescent substance hereinafter mentioned includes fluorescent substances that can be individually used with satisfactory effects. In the light emitting device of the second embodiment, the first fluorescent substance and the second fluorescent substance can efficiently utilize the light that is applied as the respective excitation source. In addition, since two kinds of light emitted by the two fluorescent substances are mixed, the light emitting device has excellent color rendering performance.

The first fluorescent substance and the second fluorescent substance may each be a single material or comprise two or more kinds of material. This increases the combinations of emission spectra, thereby making it possible to achieve the light emitting device having excellent characteristics such as color rendering performance and luminance of emitted light, by selecting a proper combination. Moreover, in case those combined are complementary colors of each other, white color can be produced efficiently. In case the second fluorescent substance is excited by the light emitted by the first fluorescent substance and the first fluorescent substance is constituted from two or more components, it is not necessary for all components of the first fluorescent substance to be used as the excitation source of the second fluorescent substance, and it suffices that any one component of the first fluorescent substance can excite the second fluorescent substance. The second fluorescent substance may be such that can be excited by both the semiconductor light emitting element and the first fluorescent substance.

Regardless of whether the first fluorescent substance and the second fluorescent substance are each constituted from one component or two or more components, the first fluorescent substance and the second fluorescent substance can emit light of colors that are complementary colors of each other. This constitution makes the light emitting device having better color rendering performance. With this constitution, color unevenness can be suppressed better than in case only one of the first fluorescent substance and the second fluorescent substance is constituted from two or more components to produce complementary colors. When the first fluorescent substance is constituted from two components to produce complementary colors, for example, degradation of one of the components due to heat degradation leads to unbalanced color tone, resulting in the color tone changing over time. This holds true also in case the second fluorescent substance is constituted from two components to produce complementary colors. When the first fluorescent substance and the second fluorescent substance emit light of colors that are complementary colors of each other and the second fluorescent substance is excited by the light emitted by the first fluorescent substance, in contrast, degradation of the first fluorescent substance results in less excitation of the second fluorescent substance and hence less color deviation, though output power and efficiency of light emission decrease.

(First Fluorescent Substance)

According to the second embodiment, the first fluorescent substance preferably has an excitation spectrum in a region at least from ultraviolet to visible light of short wavelengths. It is also preferable that the first fluorescent substance can emit light by absorbing at least part of the light emitted by the semiconductor light emitting element that has an emission spectrum ranging from near ultraviolet of wavelengths longer than 360 nm to visible light of short wavelengths, and the emission spectrum has two or more peaks at least two of which are complementary colors of each other. The first fluorescent substance may also be constituted from two or more kinds of fluorescent substance that have different emission spectra. With this constitution, it is made possible to mix the light of not only the semiconductor light emitting element but also the fluorescent substances. A fluorescent substance preferably used as the first fluorescent substance is alkali earth metal halogen-apatite fluorescent substance including at least an element represented by M1 selected from Mg, Ca, Ba, Sr and Zn and an element represented by L1 selected from Mn, Fe, Cr and Sn.

Specifically, the following materials may be used.

A fluorescent substance represented by $(M1_{1-a-b}Eu_aL1_b)_{10}(PO_4)_6Q_2$;

A fluorescent substance represented by $(M1_{1-a}Eu_a)_{10}(PO_4)_6Q_2$;

A fluorescent substance represented by $(M1_{1-a-c}Eu_aMn_b)_{10}(PO_4)_6Q_2$;

A fluorescent substance represented by $(M2_{1-a-b}Eu_aBa_c)_{10}(PO_4)_6Q_2$;

A fluorescent substance represented by $M1_{1-a}Eu_aAl_2O_4$;

A fluorescent substance represented by $M1_{1-a-b}Eu_aMn_bAl_2O_4$;

A fluorescent substance represented by $M3_{1-a-c}Eu_aCa_cAl_2O_4$;

A fluorescent substance represented by $M4_{1-a}Eu_aMgAl_{10}O_{17}$;

A fluorescent substance represented by $M4_{1-a}Eu_aMg_{1-b}Mn_bAl_{10}O_{17}$;

A fluorescent substance represented by $(M1_{1-a}Eu_a)_4Al_{14}O_{25}$;

A fluorescent substance represented by ZnS:Cu;

A fluorescent substance represented by (Zn,Cd)S:Cu, Mn; (wherein both Zn and Cd are present in the formula (Zn,Cd)S); and A fluorescent substance represented by $Re_2O_2S$:Eu.

In the formulas described above, M1 represents at least one element selected from Mg, Ca, Ba, Sr and Zn, M2 represents at least one element selected from Mg, Ca, Sr and Zn, M3 represents at least one element selected from Mg, Ba, Sr and Zn, M4 represents at least one element selected from Ca, Ba, Sr and Zn, L1 represents at least one element selected from Mn, Fe, Cr and Sn, Re represents at least one element selected from Sc, Y, La, Gd and Lu, and Q represents at least one halogen element selected from F, Cl, Br and I.

In the general formulas described above, value of a that presents the proportion of the first activation agent Eu is preferably in a range of $0.0001 \leq a \leq 0.5$. This is because the luminance of emitted light becomes too low when the value of a is less than 0.0001, and the luminance of emission tends to decrease due to concentration optical quenching when the value of a is larger than 0.5. In order to prevent the luminance of emitted light from decreasing more effectively, the value of a is more preferably in a range of $0.005 \leq a \leq 0.4$, and further more preferably in a range of $0.01 \leq a \leq 0.2$. Also the value of b that represents the proportion of at least one kind of element selected from Mn, Fe, Cr and Sn is preferably in a range from $0.0001 \leq b \leq 0.5$, more preferably in a range of $0.005 \leq b \leq 0.4$, and further more preferably in a range of $0.01 \leq b \leq 0.3$. The luminance of emission tends to decrease due to concentration optical quenching when the value of b is larger than 0.5.

When these materials are used as the first fluorescent substance excited by the light emitted by the semiconductor light emitting element having main peak around 400 nm, light of the following colors is output.

Blue light from $(M1_{1-a}Eu_a)_{10}(PO_4)_6Q_2$ and $M3_{1-a-c}Eu_aCa_cAl_2O_4$, $M4_{1-a}Eu_aMgAl_{10}O_{17}$ Bluish green light from by $(M1_{1-a}Eu_a)_4Al_{14}O_{25}$ and $(M2_{1-a-b}Eu_aBa_c)_{10}(PO_4)_6Q_2$ Green light from $M4_{1-a}Eu_aMg_{1-b}Mn_bAl_{10}O_{17}$, $M1_{1-a}Eu_aAl_2O_4$ and ZnS: Cu Amber light from (Zn,Cd)S:Cu, Mn (wherein both Zn and Cd are present in the formula (Zn,Cd)S)

Red light from $Re_2O_2S$:Eu

White light from $(M1_{1-a-b}Eu_aL1_b)_{10}(PO_4)_6Q_2$, $(M1_{1-a-c}Eu_aMn_b)_{10}(PO_4)_6Q_2$ and $M1_{1-a-b}Eu_aMn_bAl_2O_4$.

The light emitting device of the second embodiment uses the second fluorescent substance in addition to the semiconductor light emitting element and the first fluorescent substance. In case a fluorescent substance based on YAG is used as the second fluorescent substance, $(M1_{1-a-b}Eu_aL1_b)_{10}(PO_4)_6Q_2$, emits white light.

$(M1_{1-a-b}Eu_aL1_b)_{10}(PO_4)_6Q_2$ used as the first fluorescent substance is excited by light of wavelength of about 400 nm emitted by the semiconductor light emitting element so as to emit light including red component. Therefore, when the light emitting device is constituted from the first fluorescent substance and the semiconductor light emitting element, white light with strong red shade is emitted and white light having excellent color rendering performance can be produced by adding YAG fluorescent substance.

This fluorescent substance can be prepared by the process described below. Phosphate oxide that is a component of the fluorescent substance or a compound that can turn into the oxide through thermolysis and ammonium chloride are weighed and mixed in a ball mill. The mixed material is put into a crucible and is fired in a reducing atmosphere of $N_2$ or $H_2$ at a temperature from 800 to 1200° C. for 3 to 7 hours. The fired material is crushed in a wet process, sieved, dehydrated and dried thereby to obtain the alkali earth metal halogen-apatite fluorescent substance.

The fluorescent substance emits visible light from blue, white (for example, white color specified in JIS Z8110 or white color that is basic color of systematic color chart) to red color when excited by from ultraviolet to visible light of short wavelengths.

In particular, since the fluorescent substance described above can be efficiently excited also by ultraviolet rays of relatively long wavelengths around 400 nm so as to emit light with high luminance that also includes red component, good color rendering performance can be achieved with mean color rendering index Ra of 80 or higher.

The light emitting device of the second embodiment can provide higher color rendering performance by using the first fluorescent substance that is excited by the semiconductor light emitting element so as to emit light and the second fluorescent substance that has a different emission spectrum from those of the first fluorescent substance and the semiconductor light emitting element.

(Second Fluorescent Substance)

In the light emitting device of the second embodiment, the second fluorescent substance has an emission spectrum that is different from those of both the first fluorescent substance and the semiconductor light emitting element. The excitation source may be either the semiconductor light emitting element or the first fluorescent substance, or both the semiconductor light emitting element and the first fluorescent substance.

In case the second fluorescent substance can emit light upon excitation by the semiconductor light emitting element in the same manner as in the first fluorescent substance, there is no need to distinguish between the first fluorescent substance and the second fluorescent substance. In the second embodiment, however, the fluorescent substance that can be excited by the first fluorescent substance that emits light through excitation by the semiconductor light emitting element is distinguished by a different name from the first fluorescent substance for convenience.

When the semiconductor light emitting element is used as the excitation light source, fluorescent substances that can emit light by using this excitation light source are limited since the excitation light source has narrow half width. There is also such a drawback of poor color rendering performance when used for illumination as a white light source. When a semiconductor light emitting element capable of emitting blue light and a fluorescent substance that emits light of complementary color are used and the blue light emitted by the light emitting element and the yellow light emitted by the fluorescent substance are mixed, white light can be produced. While white light can be produced by mixing the blue light emitted by the light emitting element and the yellow light emitted by the fluorescent substance, the resultant light lacks red shade and therefore has poor color rendering performance when used for illumination, since the mixed light does not contain red component.

The light emitting device of the second embodiment, in contrast, can drastically improve the color rendering performance by using the second fluorescent substance as well as the first fluorescent substance. The second fluorescent substance is preferably capable of being excited by the light emitted by the semiconductor light emitting element, in the same manner as in the first fluorescent substance, so as to emit light efficiently. A fluorescent substance that is excited by the light emitted by the first fluorescent substance may also be used. In this case, efficient emission of light can be achieved by using the main peak of the first fluorescent substance as the emission light source. However, since the first fluorescent substance has broader half width than the semiconductor light emitting element does, emission spectrum of the first fluorescent substance is broader than the sharp emission spectrum of the semiconductor light emitting element. Therefore, the second fluorescent substance may also be excited by the light emitted by the first fluorescent substance of wavelength other than that of the main peak.

The second fluorescent substance can be excited either by the light emitted by the semiconductor light emitting element or by the light emitted by the first fluorescent substance. White light having reddish component and excellent color rendering performance can be emitted by using the semiconductor light emitting element capable of emitting blue light and a fluorescent substance that can emit red light, for example $(CaEuMn)_{10}(PO_4)_6Cl_2$, as the first fluorescent substance so as to compensate for white light that lacks reddish component emitted by the YAG fluorescent substance excited by the semiconductor light emitting element.

Cerium-activated fluorescent substance based on yttrium aluminum oxide may be used as the second fluorescent substance. Specifically, $YAlO_3:Ce$, $Y_3Al_5O_{12}:Ce(YAG:Ce)$, $Y_4Al_2O_9:Ce$ or a mixture of these materials may be used. Moreover, the second fluorescent substance may also include at least one element selected from Ba, Sr, Mg, Ca and Zn. Si may also be added so as to restrain the crystal growth in order to obtain uniform particles of the fluorescent substance.

In this specification, the term "cerium-activated fluorescent substance based on yttrium aluminum oxide" should be interpreted in a broad sense to include such fluorescent substance of which part or all of yttrium atoms are substituted with an element selected from a group consisting of Lu, Sc, La, Gd and Sm or part or all of aluminum atoms are substituted with an element selected from a group consisting of Ba, Tl, Ga and In.

More specifically, a photoluminescence fluorescent substance represented by general formula $(Y_zGd_{1-z})_3Al_5O_{12}:Ce$ ($0<z\leq 1$) or a photoluminescence fluorescent substance represented by general formula $(Re_{1-a}Sm_a)_3Re'_5O_{12}:Ce$ ($0\leq a<1, 0\leq b\leq 1$, wherein Re is at least one element selected from Y, Gd, La and Sc, and Re' is at least one element selected from Al, Ga and In) is used.

This fluorescent substance is highly durable against heat, light and moisture due to garnet structure, and can have peak of excitation spectrum at a wavelength around 450 nm. The emission spectrum also has a broad peak around 580 nm tailing to 700 nm.

The photoluminescence fluorescent substance includes Gd (gadolinium) in the crystal, and therefore efficiency of light emission upon excitation in a wavelength region longer than 460 nm can be made higher. When the content of Gd is increased, wavelength of the emission peak shifts to a longer wavelength with the entire emission spectrum also shifting to longer wavelengths. Accordingly, when light of reddish color is desired, it can be produced by heavily substituting with Gd. As the content of Gd increases, luminance of photoluminescence by blue light tends to decrease. In addition to Ce, such elements as Tb, Cu, Ag, Au, Fe, Cr, Nd, Dy, Co, Ni, Ti and Eu may be added.

Emission wavelengths of the fluorescent substance based on yttrium aluminum garnet oxide having garnet structure shifts toward shorter wavelengths when part of Al atoms are substituted with Ga. Emission wavelengths shifts toward longer wavelengths when part of Y atoms are substituted with Gd.

When part of Y atoms are substituted with Gd, it is preferable to restrict the proportion of Y atoms are substituted with Gd less than 10%, and control the content of Ce in a range from 0.3 to 1.0. Although green component become predominant and red component diminishes when the proportion of Y atoms substituted with Gd is less than 20%, shortage of red component can be made up by increasing the Ce content and desired color tone can be achieved without decreasing luminance. Temperature characteristic can be improved with this composition, and reliability of the light emitting device can be improved. A light emitting device that can emit light of an intermediate color such as pink can be made by using photoluminescence fluorescent substance that is made in such a constitution that emits light with much red component.

Such a photoluminescence fluorescent substance can be made in a procedure described below. First, oxides of Y, Cd, Al and Ce, or compounds that can easily turn into the oxides at a high temperature are mixed in stoichiometrical proportions. Or, alternatively, a coprecipitated oxide obtained by coprecipitation, with oxalic acid, a solution prepared by dissolving a rare earth element such as Y, Gs or Ce in stoichiometrical proportion in an acid, and firing the coprecipitate and aluminum oxide are mixed. This mixture is mixed with a fluoride such as barium fluoride or ammonium fluoride as a flux. The mixed material is put into a crucible and is fired in air at a temperature from 1350 to 1450° C. for 2 to 5 hours. The fired material is processed with a ball mill in water, washed, separated, dried and sieved.

According to the second embodiment, the photoluminescence fluorescent substance used as the second fluorescent substance may be a mixture of two or more kinds of fluorescent substance based on yttrium aluminum garnet oxide activated with cerium.

Preferable ranges of particle sizes of the first fluorescent substance and the second fluorescent substance are similar to those described in conjunction with the first embodiment, and the reason for setting in the range is also the same.

The method of measuring the particle size is also the same as that of the first embodiment.

In the second embodiment, a slurry including 90% by weight of nitrocellulose and 10% by weight of γ-alumina mixed with, for example, $(Ca_{0.96}Eu_{0.01}Mn_{0.03})_{10}(PO_4)_6Cl_2$ as the first fluorescent substance and (YAG: Ce) activated with cerium as the second fluorescent substance is applied to the inside of the glass window of the lid, and is hardened by heating at 220° C. for 30 minutes so as to form a color conversion member in advance.

Variations

While light emitting devices according to the preferred embodiments of the present invention have been described, various modifications as described below can be made according to the present invention.

In the present invention, the position where the fluorescent substance is disposed may be selected from many candidates while giving consideration to the relative position with the light emitting element and the constitution of the light emitting element.

Figure 10:
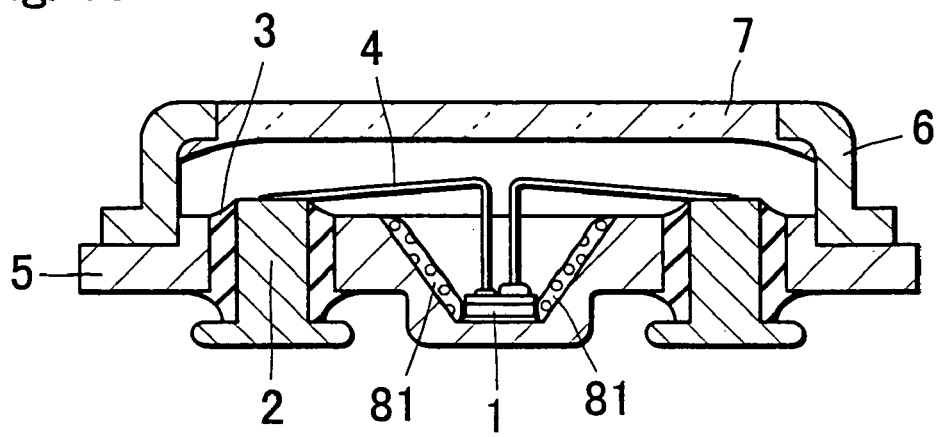
FIG. 10 is a schematic sectional view of a light emitting device of a variation according to the present invention.

In the first and second embodiments, the color conversion member 80 is formed on the inside of the window 7. The color conversion member 80 may also be formed on the side face of the recess of the package 5 as shown in FIG. 10. In this case, the p-side ohmic electrode of the LED chip 1 does not have translucency and is constituted so as to reflect the light emitted by the light emitting layer back into the semiconductor and let the light emerge from the side face of the LED chip 1.

Also such a constitution may be employs as the fluorescent substance is included in the die bonding material used for die boding of the light emitting element, or the fluorescent substance is included in the molding material that covers the light emitting element.

Thus according to the present invention, the fluorescent substance may be disposed either separately from the light emitting element or directly on the light emitting element.

In the first and second embodiments, the color conversion member 80 is formed from nitrocellulose. However, the present invention is not limited to this constitution, and the color conversion member including the fluorescent substance can be from various binders including a resin that is an organic material and glass that is an inorganic material. When an organic material is used as the binder, transparent resins that have high weatherability such as epoxy resin, acrylic resin and silicone are preferably used. Silicone is particularly preferable due to high reliability and capability to improve the characteristic to disperse the fluorescent substance.

An inorganic material may also be used as the binder. In this case, precipitation process or sol-gel process may be employed. For example, a slurry is formed by mixing the fluorescent substance, silanol $(Si(OEt)_3OH)$ and ethanol, with the silanol discharged through a nozzle is heated at 300° C. for 3 hours to turn into $SiO_2$, thereby to have the fluorescent substance deposited at a desired place. In order to apply the fluorescent substance to the window, it is preferable to use an inorganic material that has a thermal expansion coefficient similar to that of the window material, which allows secure bonding of the fluorescent substance onto the window.

An inorganic bonding material may also be used as the binder. The bonding material is low-melting point glass, that is preferably made from fine particles and is very stable with low absorptivity to light ranging from ultraviolet to visible light. These requirements are satisfied by borate made from alkali earth element in the form of fine particles obtained by precipitation.

In case a fluorescent substance having large particle size is applied, it is preferable to use a bonding material that has a high melting point and can be turned into ultra-fine powder, for example, pyrophosphate or normal phosphate made from silica, alumina or alkali earth element in the form of fine particles obtained by precipitation. These bonding materials may be used alone or in combination.

Method for applying the bonding material will be described below. For the bonding material, it is preferable to use a slurry made by dispersing the bonding material that has been crushed in a wet process in a vehicle, in order to ensure high bonding effect. The vehicle refers to a high viscosity solution made by dissolving a small amount of binding agent in an organic solvent or deionized water. For example, an organic vehicle is made by adding 1% by weight of nitrocellulose as the binding agent to butyl acetate that is used as the organic solvent.

The fluorescent substance is added to the slurry of bonding material obtained as described above, thereby to make the application liquid. While the bonding agent is added in proportion of 1 to 3% by weight of the quantity of fluorescent substance in the application liquid, it is preferable to add smaller quantity of bonding agent in order to prevent the luminous flux retaining ratio from decreasing. The application liquid prepared as described above is applied to the back surface of the window. This film is then dried by blowing warm air or hot air. Last, the film is baked at a temperature from 400 to 700° C., so as to evaporate the vehicle thereby forming the fluorescent substance layer as the color conversion member bonded at the desired place by means of the bonding agent.

(Diffusing Agent)

Further according to the present invention, a diffusing agent may be added to the fluorescent substance. For the diffusing agent, barium titanate, titanium oxide, aluminum oxide, silicon oxide or the like is preferably used. This makes it possible to obtain a light emitting device having good directivity.

The diffusing agent has median particle size in a range from 1 μm to 5 μm. The diffusing agent of median particle size in a range from 1 μm to 5 μm reflects light from the fluorescent substance randomly, and is capable of suppressing color unevenness that is apt to result from the use of fluorescent substance having larger particle sizes. The diffusing agent of size in a range from 1 μm to 5 μm, in contrast, can increase the viscosity of resin without decreasing the luminous intensity, although the effect of interfering with the light emitted by the light emitting element is lower. Thus when the resin including the fluorescent substance is applied by potting or the like, it is made possible to disperse the fluorescent substance included in the resin uniformly in a syringe and maintain this condition, so that the light emitting device can be manufactured with a high yield even when the fluorescent substance of larger particle sizes that is difficult to handle. The diffusing agent according to the present invention has different effects depending on the particle size, as described above, and can be selected and used in combination according to the application.

(Filler)

According to the present invention, the color conversion member may include a filler in addition to the fluorescent substance. The filler is made of a material similar to the diffusing agent but has median particle size different from that of the diffusing agent. In this specification, the filler refers to a material having of median particle size in a range from 1 μm to 5 μm. When the filler of this particle size is included in the light transmitting resin, variability in the chromaticity of the light emitting devices is improved by the light diffusion effect, and resistance of the light transmitting resin against thermal shock can also be improved. As a result, such troubles can be prevented as the wires connecting the light emitting element with external electrodes break and the light emitting element comes off the recess of the package even when used at high temperatures, thereby providing the light emitting device of high reliability. Moreover, it is made possible to maintain constant fluidity of the resin for a long period of time, so that the sealing member can be formed at the desired place and mass-produce the light emitting devices with high yield.

The filler preferably has particle size and/or particle shape similar to those of the fluorescent substance. In this specification, similar particle size means that difference between the median particle sizes of two materials is less than 20%, and similar particle shape means that difference between the values of roundness of the particle that indicates the proximity of the particle shape to true sphere (roundness=length of circumference of true circle of area equal to the projection area of the particle/length of circumference of the projection area of the particle) is less than 20%. Use of such a filler causes the fluorescent substance and the filler to act on each other, so that the fluorescent substance is satisfactorily dispersed in the resin thereby suppressing color unevenness.

Median particles sizes of the fluorescent substance and the filler are both controlled, for example, in a range from 15 μm to 50 μm or more preferably in a range from 20 μm to 50 μm. When the particle sizes are controlled in this range, the particles can be dispersed with proper distance from each other. As a result, paths for extracting light can be secured and directivity can be improved while suppressing the decrease in luminous intensity caused by mixing the filler.

In the present invention, the light emitting device may further contains the fluorescent substances represented by the following genera formulas (1) to (6).

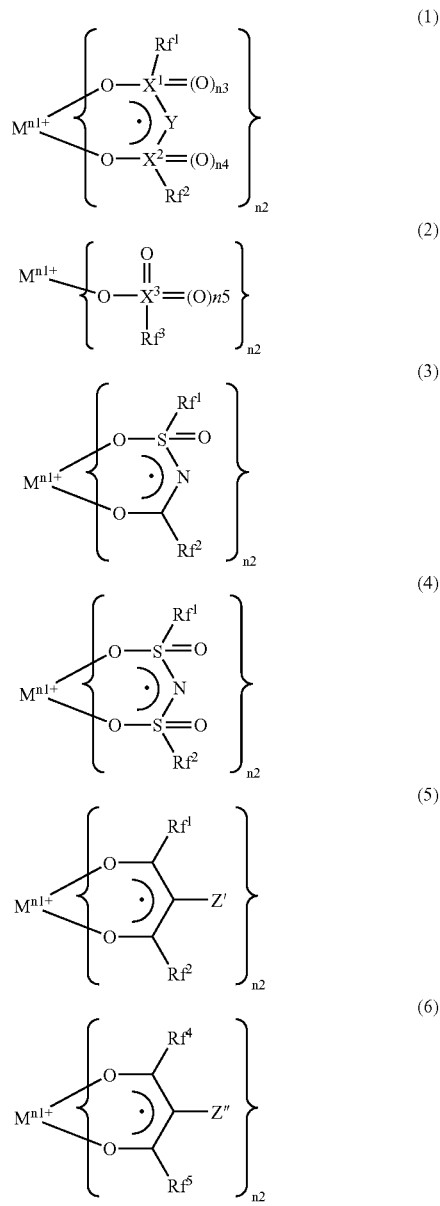

In the formulas (1) to (6), Rf1, Rf2, Rf3, Rf4 and Rf5 are the same or different and each represents a $C_1$-$C_{22}$ aliphatic group having no hydrogen atom, an aromatic group having no hydrogen atom, or a heterocyclic group having no hydrogen atom.

Example of the $C_1$-$C_{22}$ aliphatic group having no hydrogen atom include straight-chain or branched perhalogenated alkyl group such as perfluoroalkyl group ($C_nF_{2n+1}$; n=1 to 22) or perchloroalkyl group ($C_nCl_{2n+1}$; n=1 to 22), specifically trichloromethyl, trifluoromethyl, perchloroethyl, pentafluoroethyl, heptachloropropyl, heptafluoropropyl, heptachloroisopropyl, heptafluoroisopropyl, nonachlorobutyl, nonafluorobutyl, nonachloroisobutyl, nonafluoroisobutyl, undecachloropentyl, undecafluoropentyl, undecachloroisopentyl, undecafluoroisopentyl, tridecachlorohexyl, tridecafluorohexyl, tridecachloroisohexyl, tridecafluoroisohexyl, pentadecachloroheptyl, pentadecafluoroheptyl, pentadecachloroisoheptyl, pentadecafluoroisoheptyl, heptadecachlorooctyl, heptadecafluorooctyl, heptadecachloroisooctyl, heptadecafluoroisooctyl, nonadecachlorononyl, nonadecafluorononyl, nonadecachloroisononyl, nonadecafluoroisononyl, heneicosachlorodecyl, heneicosafluorodecyl, heneicosachloroisodecyl, heneicosafluoroisodecyl, tricosachloroundecyl, tricosafluoroundecyl, tricosachloroisoundecyl, tricosafluoroisoundecyl, pentacosachlorododecyl, pentacosafluorododecyl, pentacosachloroisododecyl, pentacosafluoroisododecyl, heptacosachlorotridecyl, heptacosafluorotridecyl, heptacosachloroisotridecyl, or heptacosafluoroisotridecyl;

straight-chain or branched $C_2$-$C_{22}$ perhalogenated alkenyl group such as perfluoroalkenyl group (perfluorovinyl group, perfluoroallyl group, or perfluorobutenyl group) or perchloroalkenyl group, preferably trifluoroethynyl, trichloroethynyl, pentafluoropropenyl, perchloropropenyl, heptafluorobutenyl, or heptachlorobutenyl;

straight-chain or branched $C_2$-$C_{22}$ perhalogenated alkynyl group such as perfluoroalkynyl group or perchloroalkynyl group;

$C_3$-$C_{22}$ perhalogenated cycloalkyl group such as perfluorocycloalkyl group ($C_nF_{2n-1}$; n=3 to 22, preferably 3 to 8, and more preferably 3 to 6) or perchlorocycloalkyl group ($C_nCl_{2n-1}$; n=3 to 22, preferably 3 to 8, and more preferably 3 to 6), preferably perchlorocyclopropyl, pentafluorocyclopropyl, heptachlorocylobutyl, heptafluorocylobutyl, nonachlorocyclopentyl, nonafluorocyclopentyl, undecachlorocyclohexyl, undecafluorocyclohexyl, tridecachlorocycloheptyl, tridecafluorocycloheptyl, pentadecachlorocyclooctyl, or pentadecafluorocyclooctyl;

$C_3$-$C_{22}$, preferably $C_3$-$C_8$, and more preferably $C_3$-$C_6$ perhalogenated cycloalkenyl group such as perfluorocloalkenyl group (perfluorocyclopentenyl group or perfluorocyclohexenyl group) or perchlorocycloalkenyl group; and perhalogenated aralkyl group such as perfluorobenzyl group or perfluorophenethyl group.

Example of the aromatic group in the aromatic group having no hydrogen atom include phenyl, naphthyl, anthranyl, phenanthryl, and pyrenyl.

Example of the heterocyclic group in the heterocyclic group having no hydrogen atom include pyridyl, thienyl, pyronyl, pyrimidinyl, quinolyl, isoquinolyl, benzimidazoyl, benzopyranyl, indolyl, benzofuranyl, imidazolyl, pyrazolinyl, and biphenyl, and all hydrogen atoms of these aromatic groups and heterocyclic groups are substituted with substituents having no hydrogen atom, for example, halogen atom such as fluorine atom, chlorine atom or bromine atom, nitro group, $C_1$-$C_4$ perhalogenated alkyl group (trifluoromethyl), $C_1$-$C_4$ perhalogenated alkoxy group (trifluoromethoxy), $C_2$-$C_5$ perhalogenated alkylcarbonyl group (trifluoroacetyl), $C_1$-$C_4$ perhalogenated alkylenedioxy group (difluoromethylenedioxy), $C_2$-$C_5$ perhalogenated alkenyl group (perhalogenated vinyl), perhalogenated phenoxy group, or $C_2$-$C_{22}$ perhalogenated alkylcarbonyloxy. Specific Example of the aromatic group having no hydrogen atom include perfluorophenyl group, perchlorophenyl group, perfluoronaphthyl group, perchloronaphthyl group, perfluoroanthranyl group, perchloroanthranyl group, perfluorophenanthryl group, and perchlorophenanthryl group, while specific Example of the heterocyclic group having no hydrogen atom include perhalogenated 2-pyridyl group.

One, or two or more halogen atoms attached to the aromatic ring or heterocycle of the perhalogenated aromatic group, perhalogenated heterocyclic group and perhalogenated aralkyl group may be substituted with substituents having no hydrogen atom, such as cyano, nitro, nitroso, $C_1$-$C_4$ perhalogenated alkoxy, $C_2$-$C_5$ perhalogenated alkoxycarbonyl, and $C_2$-$C_{22}$ perhalogenated alkylcarbonyloxy.

Also an ether, ester or ketone structure may be formed by making one or a plurality of O—, —COO— and —CO— to exist between C—C single bonds at arbitrary positions of the $C_1$-$C_{22}$ perhalogenated alkyl group, $C_2$-$C_{22}$ perhalogenated alkenyl group and $C_2$-$C_{22}$ perhalogenated alkynyl group.

Example of the rare earth element represented by M include lanthanoid elements such as La, Ce, Pr, Nd, Pm, Sm, Eu, Gd, Tb, Dy, Ho, Er, Tm, Yb, and Lu, and preferably Nd, Eu, Tb, and Yb.

X1 and X2 represent an atom of the group IVA such as C, Si, Ge, Sn, or Pb, or an atom of the group VIA excluding oxygen, such as S, Se, Te, or Po, preferably C, S, P or Se, and more preferably C or S.

X3 represents an atom of the group IVA such as Si, Ge, Sn, or Pb, an atom of the group VA excluding nitrogen such as P, As, Sb, or Bi, or an atom of the group VIA excluding oxygen, such as S, Se, Te, or Po, and preferably S.

Y represents C-Z' (Z' is as defined above), N, P, As, Sb or Bi, and preferably C-Z' (Z' is as defined above), N or P.

Z' represents deuterium, a halogen atom, or a $C_1$-$C_{22}$ aliphatic group having no hydrogen atom, and preferably deuterium or a straight-chain or branched $C_1$-$C_{22}$ perhalogenated alkyl group.

Z" represents H or Z'.

n1 represents 2 or 3, and preferably 3.

n2 represents 2 to 4, preferably 2 or 3, and particularly 3.

n3, n4 and n5 represent 0 or 1. When X1, X2 or X3 is s, n3, n4 or n5 is preferably 1. When X1 or X2 is C, n3 or n4 is 0.

The fluorescent substances represented by the formulas (1) to (6) are added to the in the light emitting device of the first embodiment, and may also be as the first fluorescent substance and the second fluorescent substance of the light emitting element of the second embodiment.

Examples of the present invention will be described below.

EXAMPLE 1

In Example 1, a surface-mounted light emitting device as shown in FIG. 2 is produced. The LED chip 1 has a light emitting layer that is constituted from a nitride semiconductor made of InAlGaN semiconductor having an emission peak at 375 nm in the ultraviolet region. The LED chip 1 is made by flowing TMG (trimethyl gallium) gas, TMI (trimethyl indium) gas, nitrogen gas and dopant gas together with a carrier gas onto a sapphire substrate that has been washed, so as to form a nitride semiconductor film by MOCVD process. At this time, layers of n-type nitride semiconductor and p-type nitride semiconductor are formed by switching the dopant gas between $SiH_4$ and $Cp_2Mg$.

The LED chip 1 is made in multiple quantum well structure having such a constitution as five sets of layers are stacked on the sapphire substrate, one set consisting of an n-type GaN layer made of an undoped nitride semiconductor, a GaN layer serving as n-type contact layer for forming an Si-doped n-type electrode, an n-type GaN layer made of an undoped nitride semiconductor, an AlGaN layer including Si for making an n-type cladding layer, an AlInGaN layer of constituting well layer to serve as a light emitting layer, and an AlInGaN layer that makes a barrier including more Al content than the well layer. Formed successively on the light emitting layer are an Mg-doped p-type cladding layer made of AlGaN, a GaN layer used to increase the electrostatic withstanding voltage and a GaN layer that is an Mg-doped p-type cladding layer. The sapphire substrate has a buffer layer formed thereon by growing a GaN layer at a low temperature. The p-type semiconductor is annealed at a temperature of 400° C. or higher after forming the film.

Figure 11:
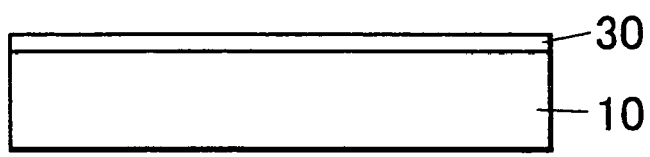
FIGS. 11A to 11E show part of manufacturing processes for the semiconductor light emitting element used in Example 1 of the present invention.
Figure 11:
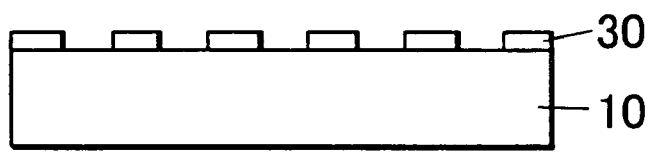
Figure 11:
Figure 11:
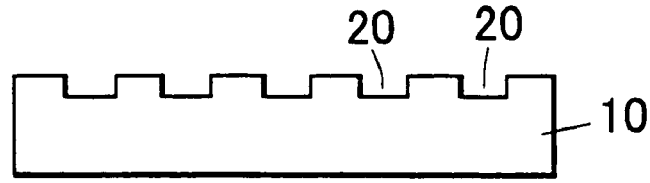
Figure 11:
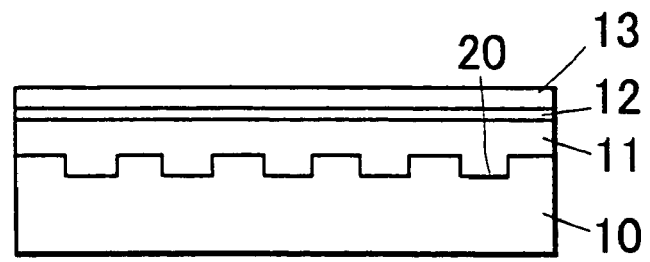

More detailed description will be given below with reference to FIGS. 11A to 11E. FIGS. 11A to 11E show the processes of manufacturing the semiconductor light emitting element. To manufacture the semiconductor light emitting element, an $SiO_2$ film 30 that makes an etching mask is formed on the sapphire substrate 10 as shown in FIG. 11A.

Then a photo mask having shape of equilateral triangle measuring 10 μm on each side is placed so that one side of the triangle is perpendicular to the orientation flat plane. With the three sides of the triangle arranged to be substantially parallel to (1-100) plane, (01-10) plane and (-1010) plane, namely the M plane of the sapphire, the $SiO_2$ film 30 and the sapphire substrate 10 are etched about 1 μm by RIE process as shown in FIG. 11B and FIG. 11C. Then as the $SiO_2$ film 30 is removed as shown in FIG. 11D, a repetitive pattern of recess 20 is formed on the surface of the sapphire substrate 10.

The bar (-) in the plane identification described above should be interpreted as a bar placed above the subsequent numeral.

Then after forming the buffer layer made of GaN on the sapphire substrate to a thickness of 200 Å at 500° C., an undoped GaN layer is formed to a thickness of 5 μm by setting the temperature to 1050° C. Thickness of the film to be grown is not limited to 5 μm, but is preferably controlled to a thickness within 10 μm, larger than that of the buffer layer. Then after growing the undoped GaN layer, the wafer is taken out of the reaction vessel, and a photo mask of stripe configuration is formed on the surface of the GaN layer. Then a mask made of $SiO_2$ having stripes 15 μm in width and spaced at 5 μm from each other is formed to a thickness of 0.1 μm with a CVD apparatus. After forming the mask, the wafer is put in the reaction vessel again to grow an undoped GaN layer 10 μm thick at 1050° C. While crystal defect density of the undoped GaN layer is $10^{10}/cm^2$ or higher, crystal defect density of the GaN layer is $10^6/cm^2$ or higher. (n-type contact layer, n-type gallium nitride compound semiconductor layer)

Then the n-type contact layer and the n-type gallium nitride compound semiconductor layer are formed. The n-type contact layer made of GaN doped with $4.5 \times 10^{18}/cm^3$ of Si is formed to a thickness of 2.25 μm at 1050° C. by using TMG gas, ammonia gas and silane gas as the impurity gas. Then with the supply of silane gas stopped, the undoped GaN layer is formed to thickness of 75 Å at 1050° C. by using TMG gas and ammonia gas, followed by the formation of 25 Å thick GaN layer doped with $4.5 \times 10^{18}/cm^3$ of Si by adding silane gas at the same temperature. Thus layer A made of undoped GaN having thickness of 75 Å and layer B made of Si-doped GaN having thickness of 25 Å. 25 sets of these layers are formed one on another to a total thickness of 2500 Å, thereby to form the n-type gallium nitride compound semiconductor layer consisting of multi-layer film of super lattice structure.

(Active Layer)

Then the barrier layer made of undoped GaN having thickness of 250 Å is formed, followed by the formation of well layer made of undoped InGaN having thickness of 30 Å by using TMG, TMI and ammonia with the temperature being set to 800° C. Seven barrier layers and six well layers are formed alternately in the order of barrier layer+well layer+barrier layer+well layer+ . . . +barrier layer, thereby forming the active layer having multiple quantum well structure to a total thickness of 1930 Å.

(p-Type Layer)

Then the p-type layer consisting of a p-side multi-layer cladding layer and a p-type contact layer is formed. The third nitride semiconductor layer made of p-type $Al_{0.2}Ga_{0.8}N$ doped with $1 \times 10^{20}/cm^3$ of Mg is formed to a thickness of 40 Å at 1050° C. by using TMA, ammonia and $Cp_2Mg$ (cyclopentadienyl magnesium). Then with the temperature being set to 800° C., the fourth nitride semiconductor layer made of $In_{0.03}Ga_{0.97}N$ doped with $1 \times 10^{20}/cm^3$ of Mg is formed to a thickness of 25 Å by using TMG, TMI, ammonia and $Cp_2Mg$. These operations are repeated so as to form the third layer and the fourth layer, each five layers, in this order with the third nitride semiconductor layer of 40 Å formed on the top, thereby forming the p-side multi-layer cladding layer having super lattice structure consisting of multi-layer film to a total thickness of 365 Å. Then the p-type contact layer made of p-type GaN doped with $1 \times 10^{20}/cm^3$ of Mg having thickness of 700 Å is formed by using TMG, ammonia and $Cp_2Mg$ at 1050° C.

After the completion of the reaction, the temperature is lowered to the room temperature and the wafer is annealed at 700° C. in nitrogen atmosphere of a reaction vessel thereby to decrease the resistivity of the p-type layer.

Since the GaN lattice grows with an offset of 30 degrees from the sapphire substrate 10, the repetitive pattern of the recesses 20 formed on the sapphire substrate 10 becomes a polygon that has sides substantially parallel to A plane (11-20), (1-210) and (-2110) plane of the GaN, and apexes on the stable growth plane (1-100), (01-10), (-1010) but does not have straight lines parallel to the stable growth plane (1-100), (01-10), (-1010), namely M planes.

Then the p-type and n-type contact layers are exposed on the same side of the nitride semiconductor on the sapphire substrate by etching. Specifically, a mask of predetermined configuration is formed on the surface of the wafer that has been taken out of the reaction vessel, and the n-type gallium nitride compound semiconductor layer is etched with an RIE (reactive ion etching) apparatus thereby to expose the surface of the n-type contact layer.

(Light Transmitting p Electrode, Base Electrode, n Electrode)

Positive and negative base electrodes are formed on the contact layers by sputtering process. The p-type nitride semiconductor has, after forming a thin metal film as the light transmitting electrode over the entire surface thereof, the base electrode formed on a part of the light transmitting electrode. Specifically, after etching, the light transmitting p electrode (Ni/Au=60/50) having thickness of 110 Å is formed so as to cover substantially the entire surface of the p-type layer, and the base electrode that is made Au with thickness of 0.5 μm and has three extension conductors is formed on the p electrode along the sizes at the corner of the light emitting element. Formed on the n-type contact layer that has been exposed by etching is the n electrode that includes W and Al so as to oppose the base electrode.

Then in order to form the n electrode, an area extending from the Mg-doped GaN, the p-type semiconductor layer and the active layer to a part of the n-type semiconductor layer is etched so as to expose the Si-doped GaN layer.

Figure 12:
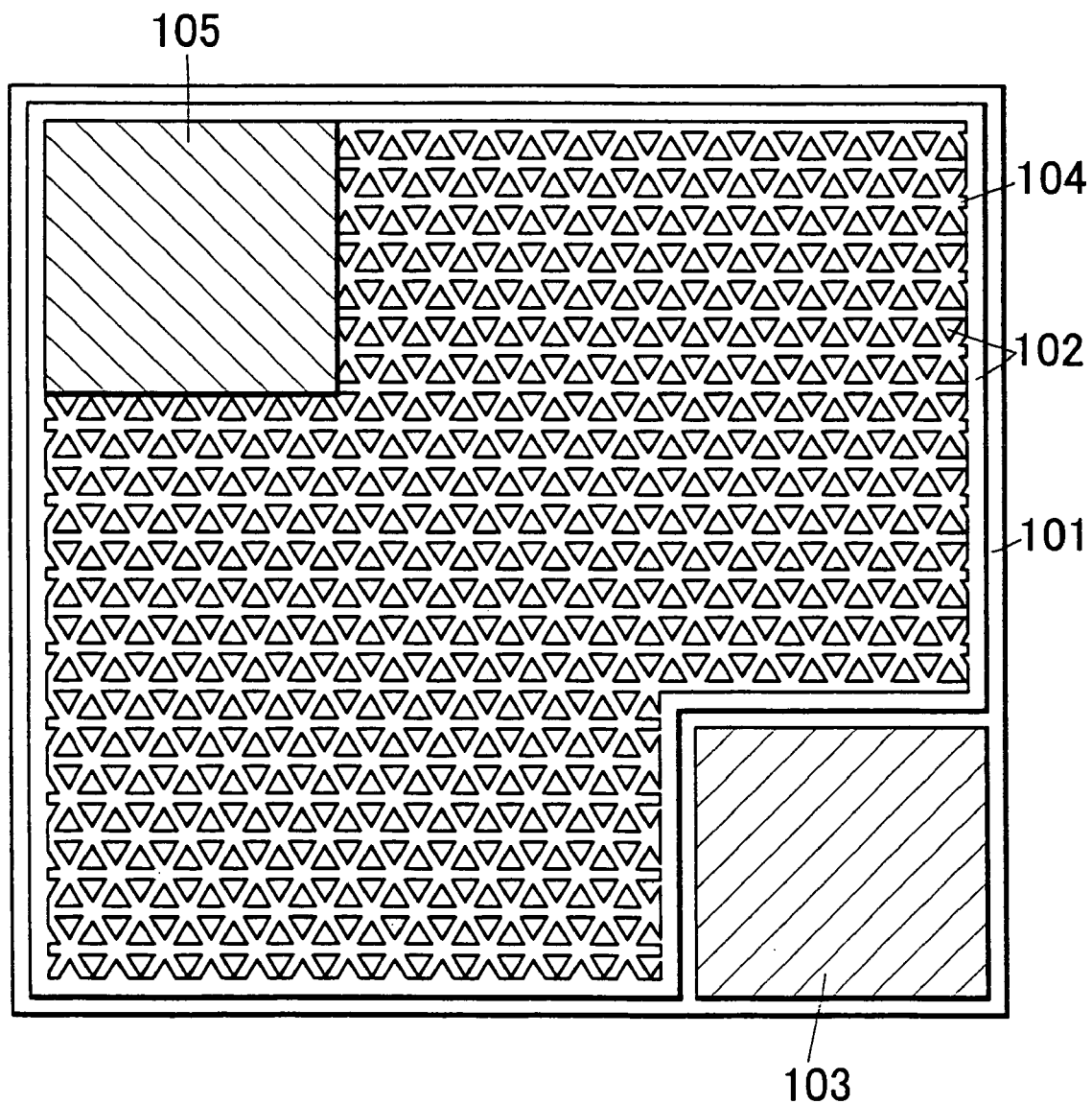
FIG. 12 is a plan view of the semiconductor light emitting element used in Example 1 of the present invention.

A photo mask, having such a pattern as equilateral triangles measuring 5 μm on each side are arranged side by side to fill out the space as shown in FIG. 12, is used to form the light transmitting p electrodes made of Ni/Au having the shape of equilateral triangle so as to cover substantially the entire surface of the p-type semiconductor layer.

Further on the light transmitting p electrodes, p pad electrodes made of Pt/Au are formed at a position opposing the exposed surface of the n-type semiconductor layer, while n electrodes made of Ti/Al and n pad electrodes made of Pt/Au are formed on the exposed surface of the n-type semiconductor layer Last, the wafer is cut into rectangular chips thereby to obtain the semiconductor light emitting element.

The semiconductor light emitting element thus obtained has improved output of light emission since the peripheral area of the p electrode emits light with higher intensity than the other area.

In another embodiment, processing of the substrate and formation of layers from the n-type semiconductor layer to the p-type semiconductor layer are carried out in the same manner as in the above.

Then in order to form the n electrode, an area extending from the Mg-doped GaN, the p-type semiconductor layer and the active layer to a part of the n-type semiconductor layer is etched so as to expose the Si-doped GaN layer.

A photo mask, having such a pattern as equilateral triangles measuring 5 μm on each side are arranged side by side to fill out the space as shown in FIG. 12, is used to form the p electrodes 104 made of Rh having the shape of equilateral triangle so as to cover substantially the entire surface of the p-type semiconductor layer.

Further on the p electrodes 104, a p pad electrodes 105 made of Pt/Au are formed at a position opposing the exposed surface of the n-type semiconductor layer, while n electrodes made of Ti/Al and n pad electrodes 103 made of Pt/Au are formed on the exposed surface of the n-type semiconductor layer Last, the wafer is cut into rectangular chips thereby to obtain the semiconductor light emitting element. Top view of the light emitting element is shown in FIG. 12.

The semiconductor light emitting element thus obtained has further increased output of light emission since the peripheral area of the p electrode emits light with higher intensity than the other area, and a material of higher reflectivity to the emitted light is used for the electrode thereby mitigating the absorption of light in the electrode.

As a casing for the light emitting device, such a package made of Kovar is used that comprises a base having a recess at the center and lead electrodes made of Kovar are fastened on both sides of the recess and are electrically insulated and hermetically sealed. Ni/Al layer is provided on the surfaces of the package and the lead electrodes.

The LED chip is die-bonded in the recess of the package that is constituted as described above, by using Ag—Sn alloy. The electrodes of the LED chip that has been die-bonded are electrically connected with Ag wires to the lead electrodes that are exposed from the bottom of the recess of the package.

Then the fluorescent substance is prepared by mixing $SrHPO_4$, $SrCO_3$, $Eu_2O_3$, $MnCO_3$ and $NH_4Cl$, in such proportions that correspond to the composition of $(Sr_{0.96},Eu_{0.01},Mn_{0.03})_{10}(PO_4)_6Cl_2$. ($SrHPO_4$: 1000 g, $SrCO_3$: 4.82.4 g, $Eu_2O_3$: 16.0 g, $MnCO_3$: 35.2 g, $NH_4Cl$: 116.5 g)

The materials are weighed and well mixed in a mixer such as ball mill in a dry process. The mixed material is put into a crucible made of SiC, quartz or alumina and is fired in reducing atmosphere of $N_2$ or $H_2$ at 1200° C. for 3 hours after raising the temperature to 1200° C. at a rate of 960° C./hr. The fired material is crushed in water, dispersed, sieved, separated, washed in water and dried thereby to obtain power of the desired fluorescent substance.

The fluorescent substance prepared as described above and $SiO_2$ as filler or diffusing agent are added to a slurry including 90% by weight of nitrocellulose and 10% by weight of γ-alumina. The slurry is applied to the back surface of the light transmitting window of the lid, and is hardened by heating at 220° C. for 30 minutes so as to form the color conversion member. After completely purging moisture from the recess of the package, the light emitting device is completed by sealing the recess with the lid made of Kovar that has a glass window at the center thereof and applying seam welding. The chromaticity coordinates of the light emitting device can be set to (x, y)=(0.384, 0.332).

COMPARATIVE EXAMPLE 1

A light emitting device is produced in the same manner as in Example 1, except for mixing $BaMg_2Al_{16}O_{27}$:Eu that emits blue light, $BaMg_2Al_{16}O_{27}$:Eu:Mn that emits green light and $Y_2O_2S$:Eu that emits red light, instead of the fluorescent substance of the present invention, in order to obtain the same chromaticity, using 100% of the material that provides the same chromaticity as Example 1, for the purpose of luminance of light emission. The light emitting device of Example 1 using excitation at 400 nm shows luminance of about 237% that of Comparative Example 1. The light emitting device using excitation at 365 nm emits white light having reddish shade showing luminance of about 157% that of Comparative Example 1.

In Examples 2 to 17, light emitting devices were produced in the same manner as in Example 1, except for replacing the fluorescent substances of Example 1 with the fluorescent substances shown in Table 1.

The results are shown in Table 2.

TABLE 1

| Examples | Fluorescent substances |
| --- | --- |
| 1 | $(Sr_{0.96},Eu_{0.01},Mn_{0.03})_{10}(PO_4)_6Cl_2$ |
| 2 | $(Sr_{0.98},Eu_{0.01},Mn_{0.01})_{10}(PO_4)_6Cl_2$ |
| 3 | $(Sr_{0.97},Eu_{0.01},Mn_{0.02})_{10}(PO_4)_6Cl_2$ |
| 4 | $(Sr_{0.95},Eu_{0.01},Mn_{0.04})_{10}(PO_4)_6Cl_2$ |
| 5 | $(Sr_{0.94},Eu_{0.01},Mn_{0.05})_{10}(PO_4)_6Cl_2$ |
| 6 | $(Sr_{0.95},Eu_{0.02},Mn_{0.03})_{10}(PO_4)_6Cl_2$ |
| 7 | $(Sr_{0.93},Eu_{0.05},Mn_{0.02})_{10}(PO_4)_6Cl_2$ |
| 8 | $(Sr_{0.89},Eu_{0.10},Mn_{0.01})_{10}(PO_4)_6Cl_2$ |
| 9 | $(Ca_{0.96},Eu_{0.01},Mn_{0.03})_{10}(PO_4)_6Cl_2$ |
| 10 | $(Ca_{0.98},Eu_{0.01},Mn_{0.01})_{10}(PO_4)_6Cl_2$ |
| 11 | $(Ca_{0.97},Eu_{0.01},Mn_{0.02})_{10}(PO_4)_6Cl_2$ |
| 12 | $(Ca_{0.95},Eu_{0.01},Mn_{0.04})_{10}(PO_4)_6Cl_2$ |
| 13 | $(Ca_{0.94},Eu_{0.01},Mn_{0.05})_{10}(PO_4)_6Cl_2$ |
| 14 | $(Ca_{0.95},Eu_{0.02},Mn_{0.03})_{10}(PO_4)_6Cl_2$ |
| 15 | $(Ca_{0.93},Eu_{0.05},Mn_{0.02})_{10}(PO_4)_6Cl_2$ |
| 16 | $(Ca_{0.89},Eu_{0.10},Mn_{0.01})_{10}(PO_4)_6Cl_2$ |
| 17 | $(Ba_{0.96},Eu_{0.01},Mn_{0.03})_{10}(PO_4)_6Cl_2$ |

In Examples 2 to 8, the proportions of $SrCO_3$, $MnCO_3$ and $Eu_2O_3$ are changed so that the fluorescent substances of compositions shown in Table 1 could be obtained.

In Examples 9 to 16, $CaHPO_4$, $CaCO_3$, $Eu_2O_3$, $MnCO_3$ and $NH_4Cl$ were used as the materials so that the fluorescent substances of compositions shown in Table 1 could be obtained.

In Example 9, for example, the materials are weighed in proportions of $CaHPO_4$: 1000 g, $CaCO_3$: 441.4 g, $Eu_2O_3$: 21.6 g, $MnCO_3$: 47.5 g and $NH_4Cl$: 157.3 g and well mixed in a mixer such as ball mill in a dry process. The mixed material is put into a crucible made of SiC, quartz or alumina and is fired in reducing atmosphere of $N_2$ or $H_2$ at 1200° C. for 3 hours after raising the temperature to 1200° C. at a rate of 960° C./hr. The fired material is crushed in water, dispersed, sieved, separated, washed in water and dried thereby to obtain power of the desired fluorescent substance.

In Examples 10 to 16, fluorescent substances were prepared in the same manner as in Example 9, except for changing the proportions of $CaCO_3$ and $MnCO_3$.

In Example 17, $BaHPO_4$, $BaCO_3$, $Eu_2O_3$, $MnCO_3$ and $NH_4Cl$ were used as the materials so that the fluorescent substances of compositions shown in Table 1 could be obtained.

Specifically, the materials are weighed in proportions of $BaHPO_4$: 1000 g, $BaCO_3$: 507.5 g, $Eu_2O_3$: 12.6 g, $MnCO_3$: 27.7 g and $NH_4Cl$: 91.7 g and well mixed in a mixer such as ball mill in a dry process. The mixed material is put into a crucible made of SiC, quartz or alumina and is fired in reducing atmosphere of $N_2$ or $H_2$ at 1200° C. for 3 hours after raising the temperature to 1200° C. at a rate of 960°/hr. The fired material is crushed in water, dispersed, sieved, separated, washed in water and dried thereby to obtain power of the desired fluorescent substance.

TABLE 2

| Examples | Characteristics | | |
|---|---|---|---|
| | Chromaticity when excited at 365 nm | Luminance when excited at 400 nm | Luminance when excited at 365 nm |
| 1 | (0.384, 0.332) | approx. 237% | approx. 157% |
| 2 | (0.309, 0.244) | approx. 189% | approx. 125% |
| 3 | (0.346, 0.287) | approx. 201% | approx. 133% |
| 4 | (0.394, 0.337) | approx. 212% | approx. 142% |
| 5 | (0.405, 0.345) | approx. 211% | approx. 132% |
| 6 | (0.360, 0.317) | approx. 248% | approx. 157% |
| 7 | (0.398, 0.384) | approx. 271% | approx. 172% |
| 8 | (0.418, 0.400) | approx. 263% | approx. 165% |
| 9 | (0.366, 0.280) | approx. 266% | approx. 182% |
| 10 | (0.183, 0.103) | approx. 201% | approx. 157% |
| 11 | (0.204, 0.125) | approx. 219% | approx. 162% |
| 12 | (0.344, 0.252) | approx. 233% | approx. 175% |
| 13 | (0.372, 0.302) | approx. 245% | approx. 171% |
| 14 | (0.354, 0.282) | approx. 267% | approx. 188% |
| 15 | (0.329, 0.261) | approx. 311% | approx. 201% |
| 16 | (0.309, 0.241) | approx. 298% | approx. 220% |
| 17 | (0.184, 0.106) | approx. 192% | approx. 125% |

Luminance when excited at 400 nm shown in Table 2 shows the ratio of luminance of emission when excited at 400 nm according to the Example to luminance of emission when excited at 400 nm according to the Comparative Example, and luminance when excited at 400 nm shown in Table 2 shows the ratio of luminance of emission when excited at 365 nm according to the Example to luminance of emission when excited at 365 nm according to the Comparative Example. The same applies to the table that shows the characteristic of the other Examples.

In Examples 18 to 25, light emitting devices were produced in the same manner as in Example 1, except for using the fluorescent substances shown in Table 3 instead of the fluorescent substance of Example 1.

The results are shown Table 4.

TABLE 3

| Examples | Fluorescent substances |
|---|---|
| 18 | $(Sr_{0.70},Ba_{0.21},Ca_{0.05},Eu_{0.01},Mn_{0.03})_{10}(PO_4)_6Cl_2$ |
| 19 | $(Sr_{0.72},Ba_{0.21},Ca_{0.05},Eu_{0.01},Mn_{0.01})_{10}(PO_4)_6Cl_2$ |
| 20 | $(Sr_{0.71},Ba_{0.21},Ca_{0.05},Eu_{0.01},Mn_{0.02})_{10}(PO_4)_6Cl_2$ |
| 21 | $(Sr_{0.69},Ba_{0.21},Ca_{0.05},Eu_{0.01},Mn_{0.04})_{10}(PO_4)_6Cl_2$ |
| 22 | $(Sr_{0.68},Ba_{0.21},Ca_{0.05},Eu_{0.01},Mn_{0.05})_{10}(PO_4)_6Cl_2$ |
| 23 | $(Sr_{0.69},Ba_{0.21},Ca_{0.05},Eu_{0.02},Mn_{0.03})_{10}(PO_4)_6Cl_2$ |
| 24 | $(Sr_{0.67},Ba_{0.21},Ca_{0.05},Eu_{0.05},Mn_{0.02})_{10}(PO_4)_6Cl_2$ |
| 25 | $(Sr_{0.63},Ba_{0.21},Ca_{0.05},Eu_{0.10},Mn_{0.01})_{10}(PO_4)_6Cl_2$ |

In Examples 18 to 25, the fluorescent substances of compositions shown in Table 3 were prepared by using $SrHPO_4$, $SrCO_3$, $BaCO_3$, $CaCO_3$, $Eu_2O_3$, $MnCO_3$ and $NH_4Cl$.

Specifically, in Example 8, the materials are weighed in proportions of $SrHPO_4$: 1000 g, $SrCO_3$: 134.0 g, $BaCO_3$: 376.2 g, $CaCO_3$: 45.4 g, $Eu_2O_3$: 16.0 g, $MnCO_3$: 35.2 g and $NH_4Cl$: 116.5 g, and well mixed in a mixer such as ball mill in a dry process.

The mixed material is put into a crucible made of SiC, quartz or alumina and is fired in reducing atmosphere of $N_2$ or $H_2$ at 1200° C. for 3 hours after raising the temperature to 1200° C. at a rate of 960° C./hr. The fired material is crushed in water, dispersed, sieved, separated, washed in water and dried therby to obtain power of the desired fluorescent substance.

In Examples 19 to 25, fluorescent substances were prepared in the same manner as in Example 18, except for changing the proportions of $SrCO_3$ and $MnCO_3$.

TABLE 4

| Examples | Characteristics | | |
|---|---|---|---|
| | Chromaticity when excited at 365 nm | Luminance when excited at 400 nm | Luminance when excited at 365 nm |
| 18 | (0.374, 0.313) | approx. 235% | approx. 148% |
| 19 | (0.299, 0.222) | approx. 182% | approx. 121% |
| 20 | (0.326, 0.259) | approx. 195% | approx. 128% |
| 21 | (0.374, 0.327) | approx. 201% | approx. 137% |
| 22 | (0.395, 0.332) | approx. 205% | approx. 130% |
| 23 | (0.348, 0.302) | approx. 230% | approx. 149% |
| 24 | (0.372, 0.370) | approx. 260% | approx. 167% |
| 25 | (0.401, 0.392) | approx. 243% | approx. 155% |

In Examples 26 to 29, light emitting devices were produced in the same manner as in Example 1, except for using the fluorescent substances shown in Table 5 instead of the fluorescent substance of Example 1.

The results are shown Table 6.

TABLE 5

| Examples | Fluorescent substances |
|---|---|
| 26 | $(Sr_{0.70},Ba_{0.20},Ca_{0.05},Eu_{0.01},Mn_{0.03},Sn_{0.01})_{10}(PO_4)_6Cl_2$ |
| 27 | $(Sr_{0.70},Ba_{0.20},Ca_{0.05},Eu_{0.01},Mn_{0.03},Fe_{0.01})_{10}(PO_4)_6Cl_2$ |
| 28 | $(Sr_{0.70},Ba_{0.20},Ca_{0.05},Eu_{0.01},Mn_{0.03},Cr_{0.01})_{10}(PO_4)_6Cl_2$ |
| 29 | $(Sr_{0.65},Ba_{0.20},Ca_{0.05},Eu_{0.01},Mn_{0.03},Cr_{0.06})_{10}(PO_4)_6Cl_2$ |

TABLE 6

| Examples | Characteristics | | |
|---|---|---|---|
| | Chromaticity when excited at 365 nm | Luminance when excited at 400 nm | Luminance when excited at 365 nm |
| 26 | (0.384, 0.294) | approx. 230% | approx. 138% |
| 27 | (0.392, 0.299) | approx. 242% | approx. 142% |
| 28 | (0.402, 0.278) | approx. 222% | approx. 132% |
| 29 | (0.410, 0.269) | approx. 198% | approx. 125% |

In Example 16, the materials of $SrHPO_4$, $SrCO_3$, $BaCO_3$, $CaCO_3$, $Eu_2O_3$, $MnCO_3$, $NH_4Cl$ and $SnO_2$ are weighed in proportions corresponding to the composition shown in Table 5 and well mixed in a mixer such as ball mill in a dry process. The mixed material is put into a crucible made of SiC, quartz or alumina and is fired in reducing atmosphere of $N_2$ or $H_2$. The fired material is crushed in water, dispersed, sieved, separated, washed in water and dried thereby to obtain powder of the desired fluorescent substance.

In Example 27, the materials of $SrHPO_4$, $SrCO_3$, $BaCO_3$, $CaCO_3$, $Eu_2O_3$, $MnCO_3$, $NH_4Cl$ and $Fe_2O_3$ are weighed in proportions corresponding to the composition shown in Table 5, and the fluorescent substance is prepared in the same manner as in Example 26.

In Example 28, the materials of $SrHPO_4$, $SrCO_3$, $BaCO_3$, $CaCO_3$, $Eu_2O_3$, $MnCO_3$, $NH_4Cl$ and $Cr_2O_3$ are weighed in proportions corresponding to the composition shown in Table 5, and the fluorescent substance is prepared in the same manner as in Example 26.

In Example 29, the materials of $SrHPO_4$, $SrCO_3$, $BaCO_3$, $CaCO_3$, $Eu_2O_3$, $MnCO_3$, $NH_4Cl$ and $Cr_2O_3$ are weighed in proportions corresponding to the composition shown in Table 5, and the fluorescent substance is prepared in the same manner as in Example 26.

EXAMPLE 30

In Example 30, the light emitting device is produced in the same manner as in Example 1, except for constituting the color conversion member by using silicone that includes 50% by weight of the same fluorescent substance as that of Example 1.

The light emitting device of Example 30 can be mass-produced satisfactorily, although the output power tends to decrease with time compared to Example 1.

EXAMPLE 31

In Example 31, light emitting device is produced in the same manner as in Example 1, except for forming the color conversion member by applying silica gel that includes 50% by weight of the same fluorescent substance as that of Example 1.

The light emitting device of Example 31 has the same effect as that of Example 1.

In Examples 32 to 43, light emitting devices were produced in the same manner as in Example 1, except for using the fluorescent substances shown in Table 7 were used instead of the fluorescent substance of Example 1.

The results are shown in Table 8.

TABLE 7

| Examples | Fluorescent substances |
|---|---|
| 32 | $(Sr_{0.93},Eu_{0.05},Mn_{0.02})_{10}(PO_4)_6Br_{1.0}Cl_{1.0}$ |
| 33 | $(Sr_{0.93},Eu_{0.05},Mn_{0.02})_{10}(PO_4)_6Br_2$ |
| 34 | $(Sr_{0.93},Eu_{0.05},Mn_{0.02})_{10}(PO_4)_6Cl_{1.0}F_{1.0}$ |
| 35 | $(Sr_{0.93},Eu_{0.05},Mn_{0.02})_{10}(PO_4)_6F_2$ |
| 36 | $(Sr_{0.93},Eu_{0.05},Mn_{0.02})_{10}(PO_4)_6Cl_{1.0}I_{1.0}$ |
| 37 | $(Sr_{0.93},Eu_{0.05},Mn_{0.02})_{10}(PO_4)_6Cl_{1.0}F_{0.5}Br_{0.5}$ |
| 38 | $(Sr_{0.93},Eu_{0.05},Mn_{0.02})_{10}(PO_4)_6Cl_{1.0}F_{0.5}I_{0.5}$ |
| 39 | $(Sr_{0.93},Eu_{0.05},Mn_{0.02})_{10}(PO_4)_6Cl_{1.0}Br_{0.5}I_{0.5}$ |
| 40 | $(Sr_{0.93},Eu_{0.05},Mn_{0.02})_{10}(PO_4)_6Cl_{0.5}F_{0.5}Br_{0.5}I_{0.5}$ |
| 41 | $(Sr_{0.93},Eu_{0.05},Mn_{0.02})_{10}(PO_4)_6Cl_{0.5}F_{1.0}Br_{0.5}$ |
| 42 | $(Sr_{0.93},Eu_{0.05},Mn_{0.02})_{10}(PO_4)_6Cl_{0.5}F_{1.0}I_{0.5}$ |
| 43 | $(Sr_{0.93},Eu_{0.05},Mn_{0.02})_{10}(PO_4)_6Cl_{1.0}F_{0.4}I_{0.3}Br_{0.3}$ |

The fluorescent substances of Examples 32 to 43 are prepared as described below.

The fluorescent substance of Example 32 was prepared by replacing half of $NH_4Cl$ among the materials used to prepare the fluorescent substance of Example 7 with $NH_4Br$.

The fluorescent substance of Example 33 was prepared by replacing all of $NH_4Cl$ among the materials used to prepare the fluorescent substance of Example 7 with $NH_4Br$.

The fluorescent substance of Example 34 was prepared by replacing half of $NH_4Cl$ among the materials used to prepare the fluorescent substance of Example 7 with $NH_4F$.

The fluorescent substance of Example 35 was prepared by replacing all of $NH_4Cl$ among the materials used to prepare the fluorescent substance of Example 7 with $NH_4F$.

The fluorescent substance of Example 36 was prepared by replacing half of $NH_4Cl$ among the materials used to prepare the fluorescent substance of Example 7 with $NH_4I$.

The fluorescent substance of Example 37 was prepared by replacing a part of $NH_4Cl$ among the materials used to prepare the fluorescent substance of Example 7 with $NH_4F$ and $NH_4Br$.

The fluorescent substance of Example 38 was prepared by replacing a part of $NH_4Cl$ among the materials used to prepare the fluorescent substance of Example 7 with $NH_4F$ and $NH_4I$.

The fluorescent substance of Example 39 was prepared by replacing a part of $NH_4Cl$ among the materials used to prepare the fluorescent substance of Example 7 with $NH_4Br$ and $NH_4I$.

The fluorescent substance of Example 40 was prepared by replacing a part of $NH_4Cl$ among the materials used to prepare the fluorescent substance of Example 7 with $NH_4F$, $NH_4Br$ and $NH_4I$.

The fluorescent substance of Example 41 was prepared by replacing $NH_4Cl$ among the materials used to prepare the fluorescent substance of Example 7 with $NH_4F$ and $NH_4Br$.

The fluorescent substance of Example 42 was prepared by replacing $NH_4Cl$ among the materials used to prepare the fluorescent substance of Example 7 with $NH_4F$ and $NH_4I$.

The fluorescent substance of Example 43 was prepared by replacing $NH_4Cl$ among the materials used to prepare the fluorescent substance of Example 7 with $NH_4I$ and $NH_4Br$.

TABLE 8

| Examples | Characteristics | | |
|---|---|---|---|
| | Chromaticity when excited at 365 nm | Luminance when excited at 400 nm | Luminance when excited at 365 nm |
| 32 | (0.358, 0.324) | approx. 301% | approx. 182% |
| 33 | (0.348, 0.316) | approx. 321% | approx. 203% |
| 34 | (0.362, 0.352) | approx. 290% | approx. 166% |
| 35 | (0.348, 0.316) | approx. 298% | approx. 173% |

TABLE 8-continued

| | Characteristics | | |
|---|---|---|---|
| Examples | Chromaticity when excited at 365 nm | Luminance when excited at 400 nm | Luminance when excited at 365 nm |
| 36 | (0.378, 0.362) | approx. 280% | approx. 163% |
| 37 | (0.363, 0.337) | approx. 293% | approx. 175% |
| 38 | (0.368, 0.347) | approx. 263% | approx. 158% |
| 39 | (0.361, 0.337) | approx. 293% | approx. 178% |
| 40 | (0.358, 0.332) | approx. 295% | approx. 178% |
| 41 | (0.348, 0.322) | approx. 315% | approx. 198% |
| 42 | (0.373, 0.342) | approx. 275% | approx. 168% |
| 43 | (0.372, 0.342) | approx. 283% | approx. 168% |

In Examples 44 to 55, light emitting devices were produced in the same manner as in Example 1, except for using the fluorescent substances shown manner in Table 9 instead of the fluorescent substance of Example 1.

The results are shown Table 10.

TABLE 9

| Examples | Fluorescent substances |
|---|---|
| 44 | $(Ca_{0.93},Eu_{0.05},Mn_{0.02})_{10}(PO_4)_6Br_{1.0}Cl_{1.0}$ |
| 45 | $(Ca_{0.93},Eu_{0.05},Mn_{0.02})_{10}(PO_4)_6Br_2$ |
| 46 | $(Ca_{0.93},Eu_{0.05},Mn_{0.02})_{10}(PO_4)_6Cl_{1.0}F_{1.0}$ |
| 47 | $(Ca_{0.93},Eu_{0.05},Mn_{0.02})_{10}(PO_4)_6F_2$ |
| 48 | $(Ca_{0.93},Eu_{0.05},Mn_{0.02})_{10}(PO_4)_6Cl_{1.0}I_{1.0}$ |
| 49 | $(Ca_{0.93},Eu_{0.05},Mn_{0.02})_{10}(PO_4)_6Cl_{1.0}F_{0.5}Br_{0.5}$ |
| 50 | $(Ca_{0.93},Eu_{0.05},Mn_{0.02})_{10}(PO_4)_6Cl_{1.0}F_{0.5}I_{0.5}$ |
| 51 | $(Ca_{0.93},Eu_{0.05},Mn_{0.02})_{10}(PO_4)_6Cl_{1.0}Br_{0.5}I_{0.5}$ |
| 52 | $(Ca_{0.93},Eu_{0.05},Mn_{0.02})_{10}(PO_4)_6Cl_{0.5}F_{0.5}Br_{0.5}I_{0.5}$ |
| 53 | $(Ca_{0.93},Eu_{0.05},Mn_{0.02})_{10}(PO_4)_6F_{1.0}Br_{1.0}$ |
| 54 | $(Ca_{0.93},Eu_{0.05},Mn_{0.02})_{10}(PO_4)_6F_{1.0}I_{1.0}$ |
| 55 | $(Sr_{0.93},Eu_{0.05},Mn_{0.02})_{10}(PO_4)_6I_{1.0}Br_{1.0}$ |

The fluorescent substances of Examples 44 to 55 are prepared as described below.

The fluorescent substance of Example 44 was prepared by replacing all of $NH_4Cl$ among the materials used to prepare the fluorescent substance of Example 15 with $NH_4Br$.

The fluorescent substance of Example 46 was prepared by replacing half of $NH_4Cl$ among the materials used to prepare the fluorescent substance of Example 15 with $NH_4F$.

The fluorescent substance of Example 47 was prepared by replacing all of $NH_4Cl$ among the materials used to prepare the fluorescent substance of Example 15 with $NH_4F$.

The fluorescent substance of Example 48 was prepared by replacing half of $NH_4Cl$ among the materials used to prepare the fluorescent substance of Example 15 with $NH_4I$.

The fluorescent substance of Example 49 was prepared by replacing a part of $NH_4Cl$ among the materials used to prepare the fluorescent substance of Example 15 with $NH_4F$ and $NH_4Br$.

The fluorescent substance of Example 50 was prepared by replacing a part of $NH_4Cl$ among the materials used to prepare the fluorescent substance of Example 15 with $NH_4F$ and $NH_4I$.

The fluorescent substance of Example 51 was prepared by replacing a part of $NH_4Cl$ among the materials used to prepare the fluorescent substance of Example 15 with $NH_4Br$ and $NH_4I$.

The fluorescent substance of Example 52 was prepared by replacing a part of $NH_4Cl$ among the materials used to prepare the fluorescent substance of Example 15 with $NH_4F$, $NH_4Br$ and $NH_4I$.

The fluorescent substance of Example 53 was prepared by replacing $NH_4Cl$ among the materials used to prepare the fluorescent substance of Example 15 with $NH_4F$ and $NH_4Br$.

The fluorescent substance of Example 54 was prepared by replacing $NH_4Cl$ among the materials used to prepare the fluorescent substance of Example 15 with $NH_4F$ and $NH_4I$.

The fluorescent substance of Example 55 was prepared by replacing $NH_4Cl$ among the materials used to prepare the fluorescent substance of Example 15 with $NH_4I$ and $NH_4Br$.

TABLE 10

| | Characteristics | | |
|---|---|---|---|
| Examples | Chromaticity when excited at 365 nm | Luminance when excited at 400 nm | Luminance when excited at 365 nm |
| 44 | (0.350, 0.328) | approx. 341% | approx. 222% |
| 45 | (0.340, 0.324) | approx. 361% | approx. 243% |
| 46 | (0.354, 0.348) | approx. 330% | approx. 196% |
| 47 | (0.356, 0.320) | approx. 338% | approx. 203% |
| 48 | (0.370, 0.358) | approx. 320% | approx. 207% |
| 49 | (0.355, 0.333) | approx. 323% | approx. 205% |
| 50 | (0.362, 0.343) | approx. 303% | approx. 188% |
| 51 | (0.353, 0.341) | approx. 331% | approx. 208% |
| 52 | (0.364, 0.336) | approx. 339% | approx. 214% |
| 53 | (0.356, 0.326) | approx. 345% | approx. 228% |
| 54 | (0.362, 0.338) | approx. 315% | approx. 198% |
| 55 | (0.363, 0.351) | approx. 318% | approx. 195% |

In Examples 56 to 67, light emitting devices were produced in the same manner as in Example 1, except for using the fluorescent substances shown in Table 11 instead of the fluorescent substance of Example 1.

The results are shown Table 12.

TABLE 11

| Examples | Fluorescent substances |
|---|---|
| 56 | $(Sr_{0.67}, Ba_{0.21}, Ca_{0.05}, Mn_{0.02})_{10}(PO_4)_6Br_{1.0}Cl_{1.0}$ |
| 57 | $(Sr_{0.67}, Ba_{0.21}, Ca_{0.05}, Mn_{0.02})_{10}(PO_4)_6Br_2$ |
| 58 | $(Sr_{0.67}, Ba_{0.21}, Ca_{0.05}, Mn_{0.02})_{10}(PO_4)_6Cl_{1.0}F_{1.0}$ |
| 59 | $(Sr_{0.67}, Ba_{0.21}, Ca_{0.05}, Mn_{0.02})_{10}(PO_4)_6F_{2.0}$ |
| 60 | $(Sr_{0.67}, Ba_{0.21}, Ca_{0.05}, Mn_{0.02})_{10}(PO_4)_6Cl_{1.0}I_{1.0}$ |
| 61 | $(Sr_{0.67}, Ba_{0.21}, Ca_{0.05}, Mn_{0.02})_{10}(PO_4)_6Cl_{1.0}F_{0.5}Br_{0.5}$ |
| 62 | $(Sr_{0.67}, Ba_{0.21}, Ca_{0.05}, Mn_{0.02})_{10}(PO_4)_6Cl_{1.0}F_{0.5}I_{0.5}$ |
| 63 | $(Sr_{0.67}, Ba_{0.21}, Ca_{0.05}, Mn_{0.02})_{10}(PO_4)_6Cl_{1.0}Br_{0.5}I_{0.5}$ |
| 64 | $(Sr_{0.67}, Ba_{0.21}, Ca_{0.05}, Mn_{0.02})_{10}(PO_4)_6Cl_{0.5}F_{0.5}Br_{0.5}I_{0.5}$ |
| 65 | $(Sr_{0.67}, Ba_{0.21}, Ca_{0.05}, Mn_{0.02})_{10}(PO_4)_6F_{1.0}Br_{1.0}$ |
| 66 | $(Sr_{0.67}, Ba_{0.21}, Ca_{0.05}, Mn_{0.02})_{10}(PO_4)_6F_{1.0}I_{1.0}$ |
| 67 | $(Sr_{0.67}, Ba_{0.21}, Ca_{0.05}, Mn_{0.02})_{10}(PO_4)_6I_{1.0}Br_{1.0}$ |

The fluorescent substances of Examples 56 to 67 are prepared as described below.

The fluorescent substance of Example 56 was prepared by replacing half of $NH_4Cl$ among the materials used to prepare the fluorescent substance of Example 24 with $NH_4Br$.

The fluorescent substance of Example 57 was prepared by replacing all of $NH_4Cl$ among the materials used to prepare the fluorescent substance of Example 24 with $NH_4Br$.

The fluorescent substance of Example 58 was prepared by replacing half of $NH_4Cl$ among the materials used to prepare the fluorescent substance of Example 24 with $NH_4F$.

The fluorescent substance of Example 59 was prepared by replacing all of $NH_4Cl$ among the materials used to prepare the fluorescent substance of Example 24 with $NH_4F$.

The fluorescent substance of Example 60 was prepared by replacing half of $NH_4Cl$ among the materials used to prepare the fluorescent substance of Example 24 with $NH_4I$.

The fluorescent substance of Example 61 was prepared by replacing a part of $NH_4Cl$ among the materials used to prepare the fluorescent substance of Example 24 with $NH_4F$ and $NH_4Br$.

The fluorescent substance of Example 62 was prepared by replacing a part of $NH_4Cl$ among the materials used to prepare the fluorescent substance of Example 24 with $NH_4F$ and $NH_4I$.

The fluorescent substance of Example 63 was prepared by replacing a part of $NH_4Cl$ among the materials used to prepare the fluorescent substance of Example 24 with $NH_4Br$ and $NH_4I$.

The fluorescent substance of Example 64 was prepared by replacing a part of $NH_4Cl$ among the materials used to prepare the fluorescent substance of Example 24 with $NH_4F$, $NH_4Br$ and $NH_4I$.

The fluorescent substance of Example 65 was prepared by replacing $NH_4Cl$ among the materials used to prepare the fluorescent substance of Example 24 with $NH_4F$ and $NH_4Br$.

The fluorescent substance of Example 66 was prepared by replacing $NH_4Cl$ among the materials used to prepare the fluorescent substance of Example 24 with $NH_4F$ and $NH_4I$.

The fluorescent substance of Example 67 was prepared by replacing $NH_4Cl$ among the materials used to prepare the fluorescent substance of Example 24 with $NH_4I$ and $NH_4Br$.

TABLE 12

| Examples | Characteristics | | |
| --- | --- | --- | --- |
| | Chromaticity when excited at 365 nm | Luminance when excited at 400 nm | Luminance when excited at 365 nm |
| 56 | (0.354, 0.322) | approx. 311% | approx. 188% |
| 57 | (0.344, 0.314) | approx. 331% | approx. 209% |
| 58 | (0.358, 0.350) | approx. 300% | approx. 172% |
| 59 | (0.344, 0.314) | approx. 308% | approx. 179% |
| 60 | (0.374, 0.360) | approx. 290% | approx. 169% |
| 61 | (0.359, 0.335) | approx. 303% | approx. 181% |
| 62 | (0.364, 0.345) | approx. 273% | approx. 164% |
| 63 | (0.357, 0.335) | approx. 305% | approx. 164% |
| 64 | (0.354, 0.330) | approx. 305% | approx. 184% |
| 65 | (0.344, 0.320) | approx. 325% | approx. 204% |
| 66 | (0.369, 0.340) | approx. 285% | approx. 172% |
| 67 | (0.368, 0.340) | approx. 293% | approx. 174% |

In Examples 68 to 77, light emitting devices were produced as described below with the results shown Table 13.

EXAMPLE 68

In Example 68, the light emitting device is produced in the same manner, except for adding $SrAl_2O_4$:Eu fluorescent substance that emits green light as the second fluorescent substance to $(Sr_{0.93},Eu_{0.5})_{10}(PO_4)_6Cl_2$ fluorescent e of Example 9.

EXAMPLE 69

In Example 69, the light emitting device is produced in the same manner, except for adding $(Sr_{0.93},Eu_{0.5})_{10}(PO_4)_6Cl_2$ fluorescent substance that emits blue light as the third fluorescent substance to the two kinds of fluorescent substance of Example 9.

EXAMPLE 70

In Example 70, the light emitting device is produced in the same manner, except for adding $La_2O_2S$:Eu fluorescent substance that emits red light as the fourth fluorescent substance to the three kinds of fluorescent substance of Example 69.

EXAMPLE 71

In Example 71, the light emitting device is produced in the same manner, except for adding $(Sr_{0.93},Eu_{0.5})_{10}(PO_4)_6Cl_2$ fluorescent substance that emits blue light as the third fluorescent substance to the two kinds of fluorescent substance of the Example 69.

EXAMPLE 72

In Example 71, the light emitting device is produced in the same manner, except for adding $La_2O_2S$:Eu fluorescent substance that emits red light as the fourth fluorescent substance to the three kinds of fluorescent substance of Example 69.

EXAMPLE 73

In Example 73, the light emitting device is produced in the same manner, except for adding a fluorescent substance prepared by mixing the materials of $CaHPO_4$, $CaCO_3$, $Eu_2O_3$, $MnCO_3$ and $NH_4Cl$ in proportions corresponding to the composition of $(Ca0.88, Eu_{1.0}, Mn_{0.02})_{10}(PO_4)_6Cl_2$, and $Sr_4Al_{14}O_{25}$:Eu fluorescent substance that emits blue green light as the second fluorescent substance to the three kinds of fluorescent substance of Example 69.

EXAMPLE 74

In Example 74, the light emitting device is produced in the same manner, except for adding $(Ca_{0.93},Eu_{0.5})_{10}(PO_4)_6Cl_2$ fluorescent substance as the third fluorescent substance to the two kinds of fluorescent substance of Example 71.

EXAMPLE 73

In Example 75, the light emitting device is produced in the same manner, except for adding $La_2O_2S$:Eu fluorescent substance that emits red light as the fourth fluorescent substance to the three kinds of fluorescent substance of Example 74.

EXAMPLE 76

In Example 76, the light emitting device is produced in the same manner, except for adding $(Ca_{0.93},Eu_{0.5})_{10}(PO_4)_6Cl_2$ fluorescent substance as the third fluorescent substance to the two kinds of fluorescent substance of Example 73.

EXAMPLE 77

In Example 77, the light emitting device is produced in the same manner, except for adding $La_2O_2S$:Eu fluorescent substance that emits red light as the fourth fluorescent substance to the three kinds of fluorescent substance of Example 71.

TABLE 13

| Examples | Characteristics | | |
|---|---|---|---|
| | Chromaticity when excited at 365 nm | Luminance when excited at 400 nm | Luminance when excited at 365 nm |
| 68 | (0.357, 0.378) | approx. 360% | approx. 235% |
| 69 | (0.312, 0.322) | approx. 320% | approx. 173% |
| 70 | (0.353, 0.321) | approx. 310% | approx. 168% |
| 71 | (0.313, 0.325) | approx. 315% | approx. 170% |
| 72 | (0.356, 0.319) | approx. 305% | approx. 166% |
| 73 | (0.353, 0.349) | approx. 375% | approx. 245% |
| 74 | (0.315, 0.325) | approx. 325% | approx. 169% |
| 75 | (0.353, 0.324) | approx. 317% | approx. 175% |
| 76 | (0.315, 0.327) | approx. 317% | approx. 172% |
| 77 | (0.354, 0.321) | approx. 312% | approx. 171% |

In Examples 78 to 154, light emitting devices were produced in the same manner as in Example 1, except for using the first fluorescent substance and the second fluorescent substance shown in Table 14 as the fluorescent substance. In Examples 78 to 154, the composition of the light emitting layer of the LED chip was adjusted so as to emit light of wavelength 400 nm.

In the column of first fluorescent substance in Table 14, entry of "Example 1" means that the same fluorescent substance as that of Example 1 is used.

As shown in Table 14, the light emitting devices of the Examples 78 to 154 are prepared by using the same fluorescent substances as those of Examples 1 to 77 are used as the first fluorescent substance, and using $Y_3Al_5O_{12}$:Ce (YAG:Ce) as the second fluorescent substance.

The second fluorescent substance is prepared by putting a mixture of oxides $Y_2O_2$, $Gd_2O_3$ and $CeO_2$ and flux such as fluoride in a crucible and firing the mixture in reducing atmosphere at 1400° C. for 3 to 7 hours, with the fired material being ball-milled, washed, separated, dried and sieved.

The second fluorescent substance may also be prepared in the same manner as in the method described above, except for using a coprecipitated oxide obtained by coprecipitation, with oxalic acid, a solution that is prepared by dissolving a rare earth element such as Y, Gs or Ce in stoichiometrical proportion in an acid, and firing the coprecipitate and aluminum oxide are mixed, with the mixture and barium fluoride used as flux being mixed and put into a crucible.

In Examples 78 to 154, a paste that has been prepared by adding the first fluorescent substance prepared in the same manner as in Examples 1 to 77, the second fluorescent substance prepared as described above and filler or diffusing agent made of $SiO_2$ to a slurry including 90% by weight of nitrocellulose, 10% by weight of γ-alumina, is applied to the back surface of the light transmitting window of the lid, and is hardened by heating at 220° C. for 30 minutes so as to form a color conversion member.

After completely purging moisture from the recess of the package, the light emitting device is completed by sealing the recess with the lid made of Kovar that has a glass window at the center thereof and applying seam welding.

The light emitting device of Example 78 that has been produced as described above emits white light showing chromaticity coordinates (x, y)=(0.360, 0.370) as shown in Table 14, and shows luminance of 24 lm/V when driven with a current of 20 mA.

Table 14 shows the characteristics (chromaticity coordinates and luminance when driven with 20 mA) of the light emitting devices of Examples 78 to 154.

TABLE 14

| Examples | First fluorescent substance | Second fluorescent substance | Chromaticity (x, y) | Luminance of emission lm/W |
|---|---|---|---|---|
| 78 | Example 1 | $Y_3Al_5O_{12}$:Ce | 0.360, 0.370 | 24 |
| 79 | Example 2 | $Y_3Al_5O_{12}$:Ce | 0.275, 0.280 | 16 |
| 80 | Example 3 | $Y_3Al_5O_{12}$:Ce | 0.325, 0.332 | 18 |
| 81 | Example 4 | $Y_3Al_5O_{12}$:Ce | 0.367, 0.386 | 25 |
| 82 | Example 5 | $Y_3Al_5O_{12}$:Ce | 0.370, 0.401 | 26 |
| 83 | Example 6 | $Y_3Al_5O_{12}$:Ce | 0.363, 0.375 | 24 |
| 84 | Example 7 | $Y_3Al_5O_{12}$:Ce | 0.355, 0.362 | 23 |
| 85 | Example 8 | $Y_3Al_5O_{12}$:Ce | 0.349, 0.354 | 21 |
| 86 | Example 9 | $Y_3Al_5O_{12}$:Ce | 0.362, 0.372 | 29 |
| 87 | Example 10 | $Y_3Al_5O_{12}$:Ce | 0.277, 0.283 | 21 |
| 88 | Example 11 | $Y_3Al_5O_{12}$:Ce | 0.327, 0.335 | 23 |
| 89 | Example 12 | $Y_3Al_5O_{12}$:Ce | 0.365, 0.382 | 30 |
| 90 | Example 13 | $Y_3Al_5O_{12}$:Ce | 0.370, 0.398 | 31 |
| 91 | Example 14 | $Y_3Al_5O_{12}$:Ce | 0.361, 0.376 | 29 |
| 92 | Example 15 | $Y_3Al_5O_{12}$:Ce | 0.358, 0.357 | 28 |
| 93 | Example 16 | $Y_3Al_5O_{12}$:Ce | 0.351, 0.353 | 26 |
| 94 | Example 17 | $Y_3Al_5O_{12}$:Ce | 0.263, 0.260 | 15 |
| 95 | Example 18 | $Y_3Al_5O_{12}$:Ce | 0.356, 0.368 | 25 |
| 96 | Example 19 | $Y_3Al_5O_{12}$:Ce | 0.278, 0.282 | 17 |
| 97 | Example 20 | $Y_3Al_5O_{12}$:Ce | 0.326, 0.334 | 20 |
| 98 | Example 21 | $Y_3Al_5O_{12}$:Ce | 0.362, 0.381 | 31 |
| 99 | Example 22 | $Y_3Al_5O_{12}$:Ce | 0.369, 0.395 | 31 |
| 100 | Example 23 | $Y_3Al_5O_{12}$:Ce | 0.357, 0.371 | 29 |
| 101 | Example 24 | $Y_3Al_5O_{12}$:Ce | 0.357, 0.362 | 28 |
| 102 | Example 25 | $Y_3Al_5O_{12}$:Ce | 0.349, 0.356 | 25 |
| 103 | Example 26 | $Y_3Al_5O_{12}$:Ce | 0.370, 0.381 | 27 |
| 104 | Example 27 | $Y_3Al_5O_{12}$:Ce | 0.372, 0.383 | 27 |
| 105 | Example 28 | $Y_3Al_5O_{12}$:Ce | 0.375, 0.386 | 28 |
| 106 | Example 29 | $Y_3Al_5O_{12}$:Ce | 0.389, 0.402 | 29 |
| 107 | Example 1 | $Y_3Al_5O_{12}$:Ce | Similar to Example 78 | |
| 108 | Example 1 | $Y_3Al_5O_{12}$:Ce | Similar to Example 78 | |
| 109 | Example 32 | $Y_3Al_5O_{12}$:Ce | 0.357, 0.361 | 28 |
| 110 | Example 33 | $Y_3Al_5O_{12}$:Ce | 0.357, 0.363 | 28 |
| 111 | Example 34 | $Y_3Al_5O_{12}$:Ce | 0.349, 0.357 | 24 |
| 112 | Example 35 | $Y_3Al_5O_{12}$:Ce | 0.347, 0.353 | 23 |
| 113 | Example 36 | $Y_3Al_5O_{12}$:Ce | 0.356, 0.361 | 22 |
| 114 | Example 37 | $Y_3Al_5O_{12}$:Ce | 0.351, 0.361 | 25 |
| 115 | Example 38 | $Y_3Al_5O_{12}$:Ce | 0.357, 0.367 | 23 |
| 116 | Example 39 | $Y_3Al_5O_{12}$:Ce | 0.357, 0.366 | 25 |
| 117 | Example 40 | $Y_3Al_5O_{12}$:Ce | 0.348, 0.356 | 24 |
| 118 | Example 41 | $Y_3Al_5O_{12}$:Ce | 0.348, 0.356 | 25 |
| 119 | Example 42 | $Y_3Al_5O_{12}$:Ce | 0.351, 0.358 | 22 |
| 120 | Example 43 | $Y_3Al_5O_{12}$:Ce | 0.349, 0.358 | 24 |
| 121 | Example 44 | $Y_3Al_5O_{12}$:Ce | 0.353, 0.363 | 31 |
| 122 | Example 45 | $Y_3Al_5O_{12}$:Ce | 0.355, 0.361 | 33 |
| 123 | Example 46 | $Y_3Al_5O_{12}$:Ce | 0.348, 0.357 | 29 |
| 124 | Example 47 | $Y_3Al_5O_{12}$:Ce | 0.346, 0.352 | 28 |
| 125 | Example 48 | $Y_3Al_5O_{12}$:Ce | 0.355, 0.362 | 27 |
| 126 | Example 49 | $Y_3Al_5O_{12}$:Ce | 0.352, 0.363 | 30 |
| 127 | Example 50 | $Y_3Al_5O_{12}$:Ce | 0.357, 0.364 | 28 |
| 128 | Example 51 | $Y_3Al_5O_{12}$:Ce | 0.355, 0.364 | 30 |
| 129 | Example 52 | $Y_3Al_5O_{12}$:Ce | 0.349, 0.357 | 29 |
| 130 | Example 53 | $Y_3Al_5O_{12}$:Ce | 0.347, 0.358 | 30 |
| 131 | Example 54 | $Y_3Al_5O_{12}$:Ce | 0.349, 0.359 | 27 |
| 132 | Example 55 | $Y_3Al_5O_{12}$:Ce | 0.348, 0.356 | 29 |
| 133 | Example 56 | $Y_3Al_5O_{12}$:Ce | 0.355, 0.362 | 29 |
| 134 | Example 57 | $Y_3Al_5O_{12}$:Ce | 0.350, 0.357 | 30 |
| 135 | Example 58 | $Y_3Al_5O_{12}$:Ce | 0.349, 0.358 | 27 |
| 136 | Example 59 | $Y_3Al_5O_{12}$:Ce | 0.357, 0.363 | 26 |
| 137 | Example 60 | $Y_3Al_5O_{12}$:Ce | 0.357, 0.366 | 24 |
| 138 | Example 61 | $Y_3Al_5O_{12}$:Ce | 0.353, 0.360 | 29 |
| 139 | Example 62 | $Y_3Al_5O_{12}$:Ce | 0.350, 0.361 | 27 |
| 140 | Example 63 | $Y_3Al_5O_{12}$:Ce | 0.349, 0.356 | 24 |
| 141 | Example 64 | $Y_3Al_5O_{12}$:Ce | 0.351, 0.362 | 28 |
| 142 | Example 65 | $Y_3Al_5O_{12}$:Ce | 0.348, 0.353 | 29 |
| 143 | Example 66 | $Y_3Al_5O_{12}$:Ce | 0.362, 0.370 | 25 |
| 144 | Example 67 | $Y_3Al_5O_{12}$:Ce | 0.350, 0.358 | 28 |
| 145 | Example 68 | $Y_3Al_5O_{12}$:Ce | 0.357, 0.363 | 32 |
| 146 | Example 69 | $Y_3Al_5O_{12}$:Ce | 0.323, 0.332 | 27 |
| 147 | Example 70 | $Y_3Al_5O_{12}$:Ce | 0.367, 0.373 | 31 |
| 148 | Example 71 | $Y_3Al_5O_{12}$:Ce | 0.357, 0.363 | 25 |
| 149 | Example 72 | $Y_3Al_5O_{12}$:Ce | 0.367, 0.370 | 29 |
| 150 | Example 73 | $Y_3Al_5O_{12}$:Ce | 0.353, 0.362 | 31 |
| 151 | Example 74 | $Y_3Al_5O_{12}$:Ce | 0.333, 0.345 | 27 |
| 152 | Example 75 | $Y_3Al_5O_{12}$:Ce | 0.362, 0.370 | 29 |

TABLE 14-continued

| Examples | First fluorescent substance | Second fluorescent substance | Chromaticity (x, y) | Luminance of emission lm/W |
|---|---|---|---|---|
| 153 | Example 76 | $Y_3Al_5O_{12}$:Ce | 0.337, 0.348 | 26 |
| 154 | Example 77 | $Y_3Al_5O_{12}$:Ce | 0.362, 0.368 | 28 |

The light emitting device of Example 107 was produced in the same manner as in Example 31, except for forming the color conversion member in the same manner as in Example 30 and the light emitting device of Example 108 was produced in the same manner as in Example 78, except for forming the color conversion member in the same manner as in Example 31.

While chromaticity when excited with 365 nm is shown for Examples 1 to 154, similar values of chromaticity were observed in both cases of exciting with 400 nm and 365 nm in Examples 1 to 154.

As described above by way of Example, the present invention provides the light emitting device that has good color rendering performance and can suppress changes in chromaticity.

Also according to the present invention, desired color tone can be achieved by controlling the composition of the fluorescent substance, when the fluorescent substance is excited by light in a region ranging from ultraviolet to visible light of short wavelengths.

INDUSTRIAL APPLICABILITY

The light emitting device of the present invention makes use of the advantages of the semiconductor light emitting element and provides better light source than the prior art for applications including illumination.

Thus, the present invention provides the excellent light emitting device that can be used for such applications as signal light, illumination, display, indicator and other light sources.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A white light emitting device comprising:
    a light emitting element,
    a first fluorescent substance having a peak wavelength in a range from 575 nm to 630 nm,
    a second fluorescent substance capable of emitting a light in a range from blue to red, said second fluorescent substance being different from the first fluorescent substance, said second fluorescent substance being represented by $(M_{1-a-b}Eu_aL1_b)_{10}(PO_4)_6Q_2$ (M representing at least one kind of element selected from Mg, Ca, Ba, Sr and Zn; L1 representing at least one kind of element selected from Mn, Fe, Cr and Sn; and Q representing at least one kind of halogen element selected from F, Cl, Br and I, where $0.0001 \leq a \leq 0.5$ and $0.0001 \leq b \leq 0.5$).

2. The white light emitting device according to claim 1, wherein a light outputted from the device is not including a visible component of the light outputted from the light emitting element.

3. The white light emitting device according to claim 1, wherein the light outputted from the light emitting element has a wavelength in a range from 340 nm to 440 nm.

4. The white light emitting device according to claim 1, wherein the light emitting element has an active layer of InGaN.

5. The white light emitting device according to claim 1, wherein said first fluorescent substance has another peak wavelength in a range from 380 nm to 485 nm.

6. The white light emitting device according to claim 1, wherein said first fluorescent substance comprises Eu and Mn.

7. The white light emitting device according to claim 1, wherein said first fluorescent substance comprises at least one selected from the group consisting of Mg, Ca, Ba, Sr and Zn.

* * * * *